(12) United States Patent
Hirashima et al.

(10) Patent No.: US 6,569,764 B1
(45) Date of Patent: May 27, 2003

(54) METHOD OF MANUFACTURING A SEMICONDUCTOR PACKAGE BY ATTACHING A LEAD FRAME TO A SEMICONDUCTOR CHIP VIA PROJECTING ELECTRODES AND AN INSULATING SHEET OF RESIN MATERIAL

(75) Inventors: Toshinori Hirashima, Takasaki (JP); Yasushi Takahashi, Takasaki (JP); Ryoichi Kajiwara, Hitachi (JP); Masahiro Koizumi, Hitachi (JP); Munehisa Kishimoto, Kamakura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/650,076

(22) Filed: Aug. 29, 2000

Related U.S. Application Data

(62) Division of application No. 09/504,950, filed on Feb. 16, 2000, now abandoned.

(30) Foreign Application Priority Data

Aug. 25, 1999 (JP) ............................................ 11-238859

(51) Int. Cl.$^7$ ......................... H01L 21/44; H01L 21/48; H01L 21/50; H01L 23/495; H01L 23/48; H01L 23/52; H01L 29/40
(52) U.S. Cl. ..................... 438/673; 438/111; 257/673; 257/738
(58) Field of Search ................................ 438/111, 613; 257/673, 738

(56) References Cited

U.S. PATENT DOCUMENTS 5,365,107 A * 11/1994 Kuraishi et al. ............. 257/673

6,018,191 A * 1/2000 Murakami et al. .......... 257/691
6,043,430 A * 3/2000 Chun ......................... 174/52.4

FOREIGN PATENT DOCUMENTS

| JP | 02276259 A | * 11/1990 | ........... H01L/21/60 |
| JP | 10-41694 | 2/1998 | |
| JP | 11-3909 | 1/1999 | |

OTHER PUBLICATIONS

Toshiba Review, vol. 53, No. 11, 1998, pp. 45–47.

* cited by examiner

*Primary Examiner*—Carl Whitehead, Jr.
*Assistant Examiner*—Nema Berezny
(74) *Attorney, Agent, or Firm*—Mattingly, Stanger & Malur, P.C.

(57) ABSTRACT

The semiconductor device includes a semiconductor chip having a first electrode and a second electrode formed on a first main surface and a third electrode formed on a second main surface opposite the first main surface. A first portion of a first lead is placed on the first electrode and a second portion of the first lead is located outside the semiconductor chip. A first portion of a second lead is placed on the second electrode and a second portion of the second lead is located outside the semiconductor chip. A plurality of projecting electrodes are provided between the first portion of the first lead and the first electrode and between the first portion of the second lead and the second electrode to electrically connect them. An insulating sheet is provided between the first portion of the first lead and the first main surface of the semiconductor chip and between the first portion of the second lead and the first main surface of the semiconductor chip. The insulating sheet covers the first main surface of the semiconductor chip in areas other than a region in which the plurality of projecting electrodes are provided.

5 Claims, 28 Drawing Sheets

METHOD OF MANUFACTURING A SEMICONDUCTOR PACKAGE BY ATTACHING A LEAD FRAME TO A SEMICONDUCTOR CHIP VIA PROJECTING ELECTRODES AND AN INSULATING SHEET OF RESIN MATERIAL

This is a divisional application of U.S. Ser. No. 09/504,950, filed Feb. 16, 2000, now abandoned.

BACKGROUND OF THE INVENTION

The present invention relates to a package technique suitable for a semiconductor device.

A power transistor having a surface mount type plastic-package structure called TSSOP (Thin Shrink Small Qutline Package), for example, is known as a semiconductor device. The TSSOP type power transistor is heavily used in a portable telephone, a charger for a video camera or the like, and a power circuit for a personal computer or the like.

The TSSOP type power transistor principally includes a semiconductor chip in which electrodes are formed on an element forming surface and a rear surface opposite to each other, a supporting member for supporting the rear surface of the semiconductor chip, a resin sealing body for sealing the semiconductor chip, and a plurality of leads. The plurality of leads have inner lead portions (also called inner leads) which extend over the interior and exterior of the resin sealing body and are local ed inside the resin sealing body, and outer lead portions (also called outer leads) located outside the resin sealing Body, respect rely. The outer lead portions of the plurality of leads are respectively bent and formed in a gulling type corresponding to one of lead figurations for surface mount. The inner lead portions of some of the plurality of leads are electrically connected to the electrodes on the element forming surface of the semiconductor chip through conductive wires, whereas the inner lead portions of other leads are electrically connected to the electrodes on the rear surface of the semiconductor chip through the supporting member.

Incidentally, the TSSOP type power transistor has been described in, for example, Toshiba Review, Vol. 53 No. 11 (1998), pp. 45–47 (2.5V driven-type III generation trench gate MOSFET).

SUMMARY OF THE INVENTION

As a result of discussions about a package (semiconductor package) for a semiconductor device by the present inventors, they have found out the following problems:

(1) With reductions in the size and weight of electronic equipment, semiconductor devices incorporated into these electronic equipment have been reduced in thickness. Since the reductions in the size and weight of the electronic equipment are expected to be pursued even from now on, it is necessary to achieve a further reduction in the thickness of the semiconductor device.

As in the case of the TSSOP type, however, the package structure for sealing then semiconductor chip by transfer molding (resin mold) needs a resin passage for allowing a resin to flow into the element forming surface side and rear surface side of the semiconductor chip when the transfer molding is carried out by using a molding die. Since the thickness of the entire package becomes thick by a portion equivalent to the thickness of the resin passage, a further reduction in thickness is difficult.

In the package structure for electrically connecting the electrodes on the element forming surface of the semiconductor chip and the leads thereof by the conductive wires, as in the case of the TSSOP type, the thickness of a resin on the element forming surface side of the semiconductor chip becomes thick by a portion equivalent to a loop height (corresponding to the height from the element forming surface of the semiconductor chip to the top extending in the vertical direction thereof) of each conductive wire. It is therefore difficult to achieve a further reduction in thickness.

(2) Since the amount of a current to be handled is large in the power transistor, it is desired to provide a package structure excellent in heat radiation property for discharging or radiating heat produced from the semiconductor chip into the outside. However, since the semiconductor chip and the inner lead portions of the leads are covered with a resin low in thermal conductivity in the package structure for sealing she semiconductor chip and the inner lead portions of the leads with the resin sealing body, as in the case of the TSSOP type, the heat radiation property for discharging the head generated in the semiconductor chip into the outside is low.

(3) In the package structure for electrically connecting the electrodes and leads on the element forming surface of the semiconductor chip by the conductive wires, as in the case of the TSSOP type, a conductive oath between each electrode and lead of the semiconductor chin becomes long, thereby leading to a hindrance to a reduction in on resistance in the power transistor and a hindrance to the speeding up of a semiconductor device having a semiconductor chip equipped with circuits.

An object of the present invention is to provide a technique capable of achieving a reduction in the thickness of a semiconductor device.

Another object of the present invention is to provide a technique capable of achieving an improvement in the heat radiation property of a semiconductor device.

A further object of the present invention is to provide a technique capable of achieving a reduction in the on resistance of a semiconductor device.

A still further object of the present inventions to proved a technique capable of achieving the speeding up of a semiconductor device The above, other objects and novel features of the present invention will become apparent from the description of the present specification and the accompanying drawings.

Summaries of typical ones of the inventions disclosed in the present application will be described briefly as follows:

(1) A semiconductor device comprises:
  a semiconductor chip having a first main surface and a second main surface opposite to each other, first and second electrodes formed on the first main surface, and a third electrode formed on the second main surface,
  a first lead having a first portion placed on the first electrode and a second portion continuously formed with the first portion and placed outside the semiconductor chip,
  a second lead having a first portion placed on the second electrode and a second portion continuously formed with the first portion and placed outside the semiconductor chip,
  a plurality of projecting electrodes which are disposed between the first portion of the first lead and the first electrode and between the first portion of the second lead and the second electrode and electrically connect the respective portions to one another, and
  an insulating sheet which is disposed between the first portion of the first lead and the first main surface of the semiconductor chip and between the first portion of the second lead and the first main surface of the semiconductor chip, and covers the first main surface of the semiconductor chip other than a region in which the plurality of projecting electrodes are disposed.

(2) In the semiconductor device described in the means (1), the first electrode is a source electrode, the second electrode is a gate electrode, and the third electrode is a drain electrode.

(3) In the semiconductor device described in the means (1), the first electrode is a drain electrode, the second electrode is a gate electrode, and the third electrode is a source electrode.

(4) In the semiconductor device described in the means (1), the respective second portions of the first and second leads are bent so that tip portions thereof are located on the second main surface side of the semiconductor chip.

(5) A semiconductor device comprises:
  a semiconductor chip having a first main surface and a second main surface opposite to each other, first and second electrodes formed on the first main surface, and a third electrode formed on the second main surface and having a flat surface formed in the form of a square,
  at least one first lead having a first portion placed on the first electrode and a second portion which is continuously formed with the first portion and placed outside a first side of the first side and a second side opposite to each other, of the semiconductor chip and which has a projecting part which projects from the first portion to the outside of the semiconductor chip, a transitional part bent toward the second main surface side of the semiconductor chip from the projecting part, and a mounting part which extends in the same direction as the projecting part as viewed from the transitional part,
  at least one second lead having a first portion placed on the second electrode and a second portion which is continuously formed with the first portion and placed outside the first side of the semiconductor chip and which has a projecting part which projects from the first portion to the outside of the semiconductor chip, a transitional cart bent toward the second main surface side of the semiconductor chin from the projecting part, and a mounting part which extends in the same direction as the projecting part from the transitional part,
  a plurality of projecting electrodes which are disposed between the first portion of the first lead and the first electrode and between the first portion of the second lead and the second electrode and electrically connect the respective portions to one another, and
  an insulating sheet winch is disposed between the first portion of the first lead and the first main surface of the semiconductor chip and between the first portion of the second lead and the first main surface of the semiconductor chip and which covers the first main surface of the semiconductor chip other than a region in which the plurality of projecting electrodes are disposed, and
  wherein the first lead is formed in a width broader than that of the second lead, and the second portion of the first lead is provided with one or a plurality of slits extending from a tip portion thereof to the semiconductor chip.

(6) There is provided a method of manufacturing a semiconductor device comprising:
  a semiconductor chip having a first main surface and a second main surface opposite to each other, first and second electrodes formed on the first main surface, and a third electrode formed on the second main surface,
  a first lead having a first portion placed on the first electrode and a second portion continuously formed with the first portion and placed outside the semiconductor chip,
  a second lead having a first portion placed on the second electrode and a second portion continuously formed with the first portion and placed outside the semiconductor chip,
  a plurality of projecting electrodes which are disposed between the first portion of the first lead and the first electrode and between the first portion of the second lead and the second electrode and electrically connect the respective portions to one another, and
  an insulating sheet which is disposed between the first portion of the first lead and the first main surface of the semiconductor chip and between the first portion of the second lead and the first main surface of the semiconductor chip and which covers the first main surface of the semiconductor chip other than a region in which the plurality of projecting electrodes are disposed, which comprises the step:
  a step for bending and forming the respective second portions of the first and second leads to thereby locate the tip portions of the second portions on the second main surface side of the semiconductor chip before a step for electrically connecting the respective first portions of the first and second leads by thermocompression in a state in which the insulating sheet and the projecting electrodes are interposed between the first electrode of the semiconductor chip and the first portion of the first lead and between the second electrode of the semiconductor chip and the first portion of the second lead.

(7) A semiconductor device comprises:
  a semiconductor chip having a first main surface and a second main surface opposite to each other and a plurality of electrodes and circuits formed on the first main surface,
  a plurality of leads each having a first portion placed on each electrode of the semiconductor chip and a second portion formed integrally with the first portion and placed outside the semiconductor chip,
  a plurality of projecting electrodes which are disposed between the first portions of the respective leads and the respective electrodes of the semiconductor chip and electrically connect their portions to one another, and
  an insulating sheet which is disposed between the first portions of the respective leads and the first main surface of the semiconductor chip and covers the first main surface of the semiconductor chip other than a region in which the plurality of protecting electrodes are disposed.

(8) In the semiconductor device described in the means (7), the second portions of the respective leads are bent so that tip portions thereof are located on the second main surface side of the semiconductor chip.

As a result of investigations of examples known to date from the result of the present invention, the known reference 1 (Japanese Patent Application Laid-Open No. Hei 10(1998)-41694) and the known reference 2 (Japanese Patent Application Laid-Open No. Hei 11(1999)-3909) have been found in which a technique for connecting a semiconductor chip to a substrate by an insulating film has been described. However, the conceptions of the known references 1 and 2 respectively show a technique for directly mounting a chip on a substrate and make no mention of a technique for connecting a chip to a lead frame. Further, no mention is made even of a reduction in the thickness of a semiconductor device and a heat radiation property thereof.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Figure 1:
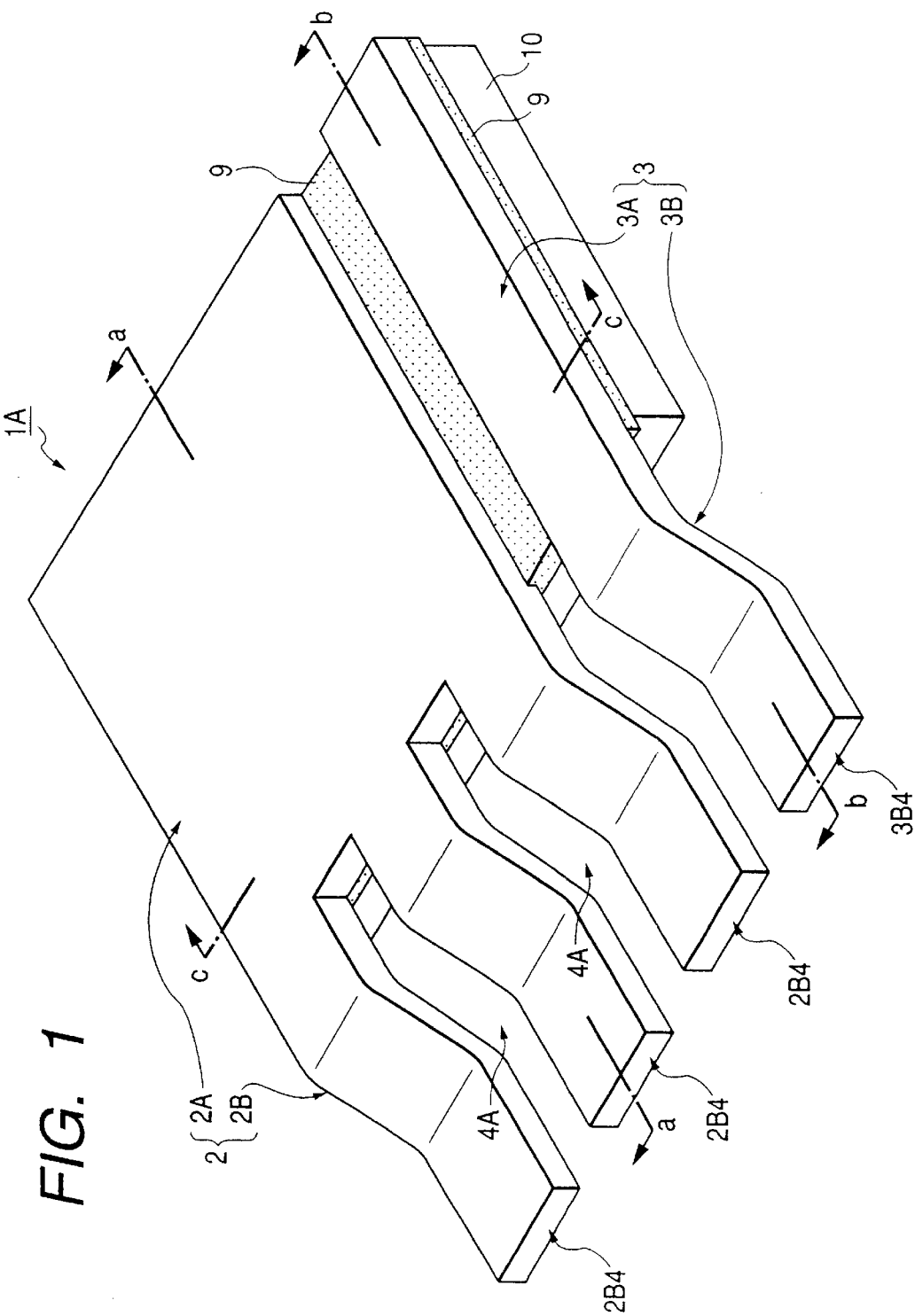
FIG. 1 is a typical perspective view showing a schematic configuration of a power transistor according to an embodiment 1 of the present invention.

Preferred embodiments of the present invention will hereinafter be described in detail with reference to the accompanying drawings. Incidentally, ones or components having the same function in all the drawings for describing the embodiments so the present invention are identified by the same reference numerals and their repetitive description will be omitted.

(Embodiment 1):

In the present embodiment, an example in which the present invention is applied to a power transistor corresponding to a semiconductor device, will be described.

Figure 2:
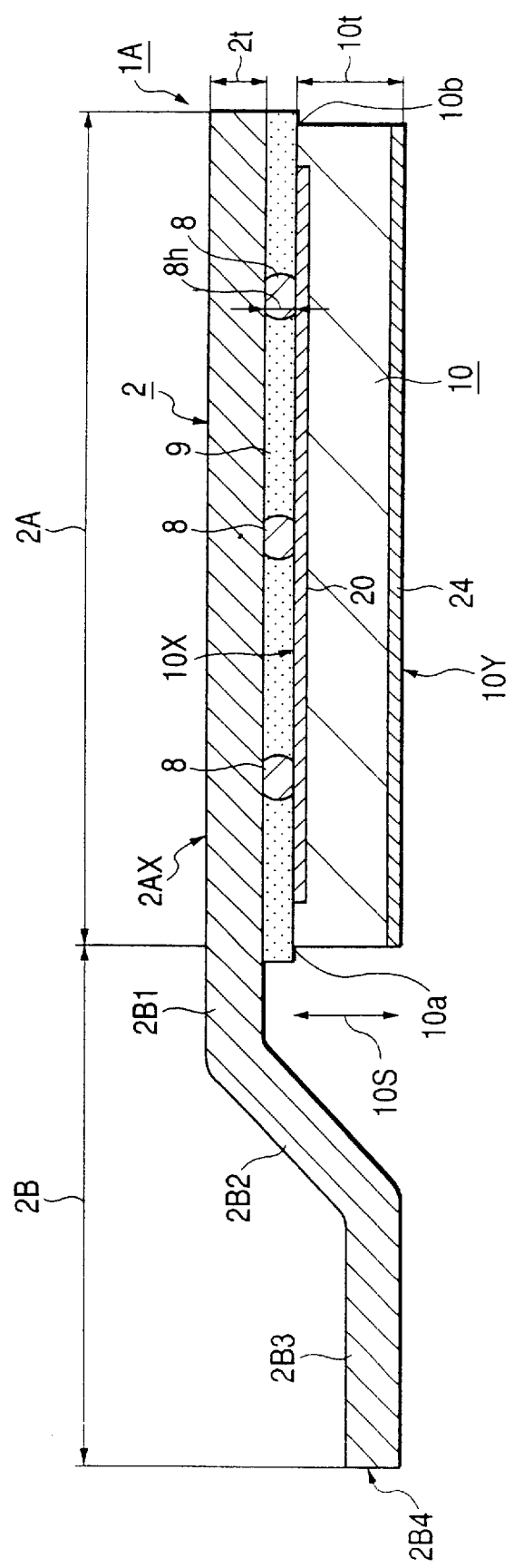
FIG. 2 is a typical cross-sectional view taken along line a—a of FIG. 1.
Figure 3:
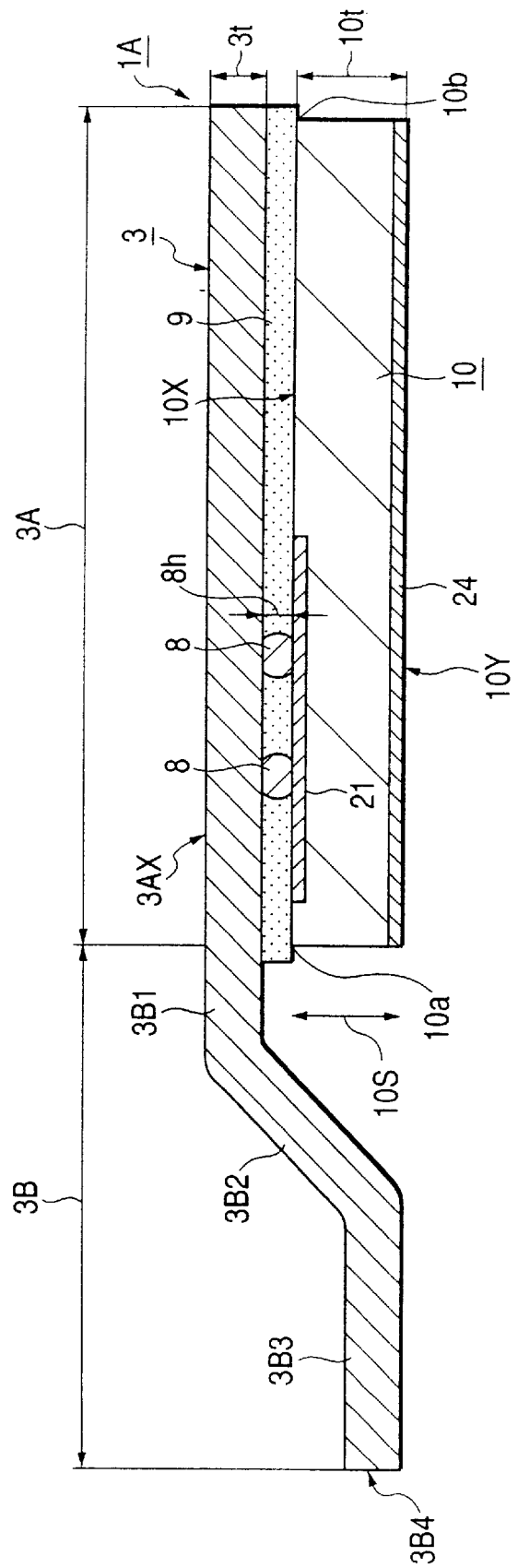
FIG. 3 is a typical cross-sectional view taken alone line b—b of FIG. 1.
Figure 4:
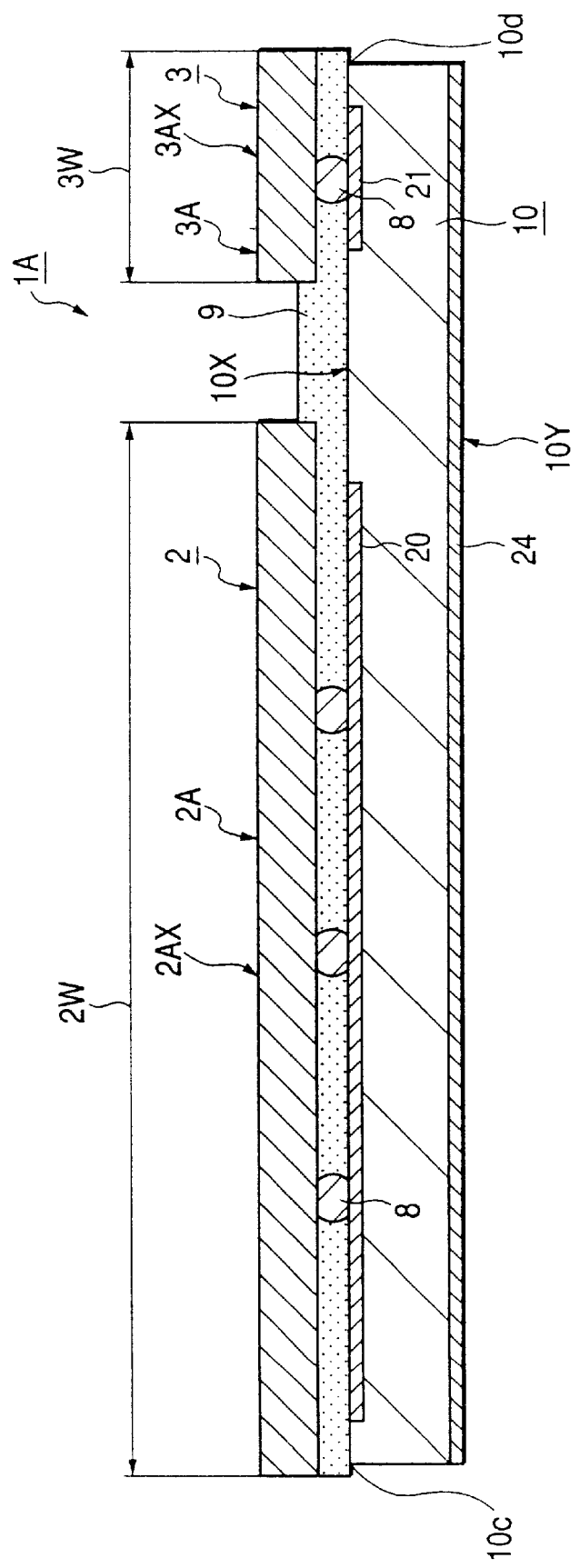
FIG. 4 is a typical cross-sectional view taken along line c—c of FIG. 1.
Figure 5:
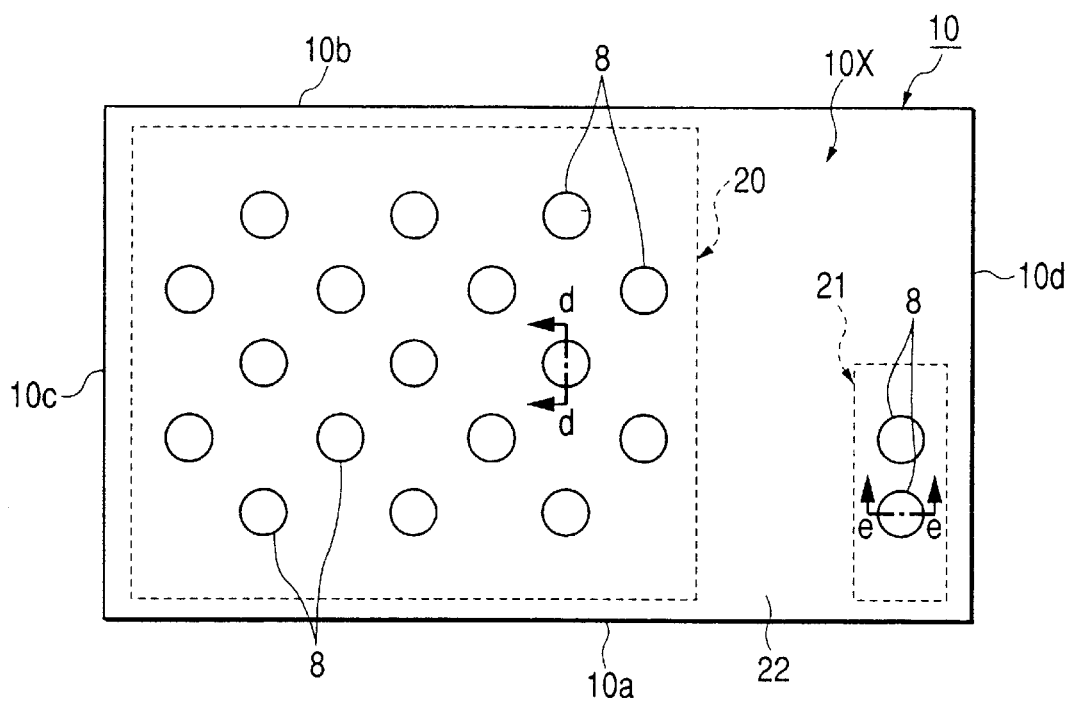
FIG. 5 is a typical plan view snowing a schematic configuration of a semiconductor chip shown in FIG. 1.
Figure 6:
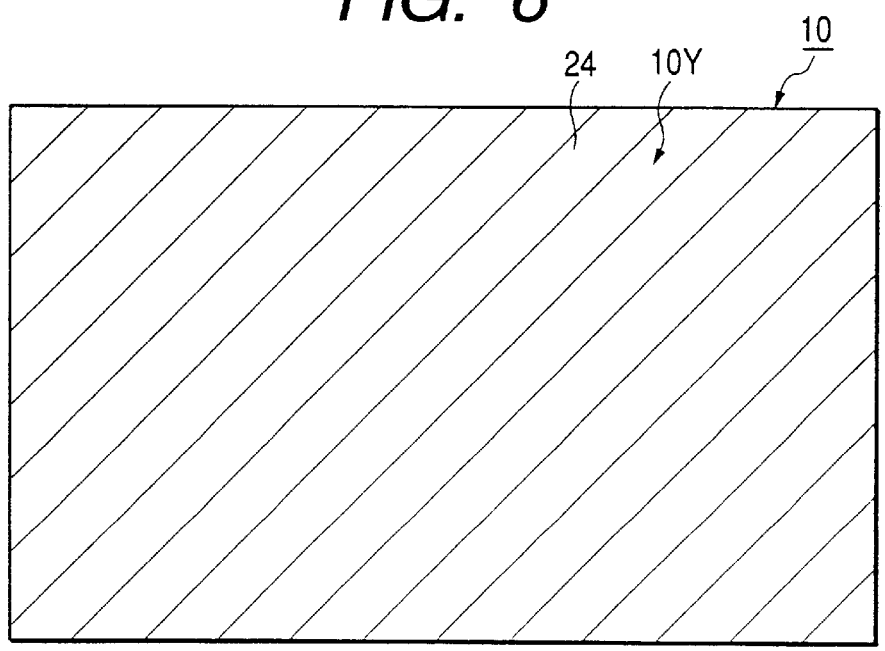
FIG. 6 is a typical bottom view illustrating the schematic configuration of the semiconductor chip shown in FIG. 1.
Figure 7:
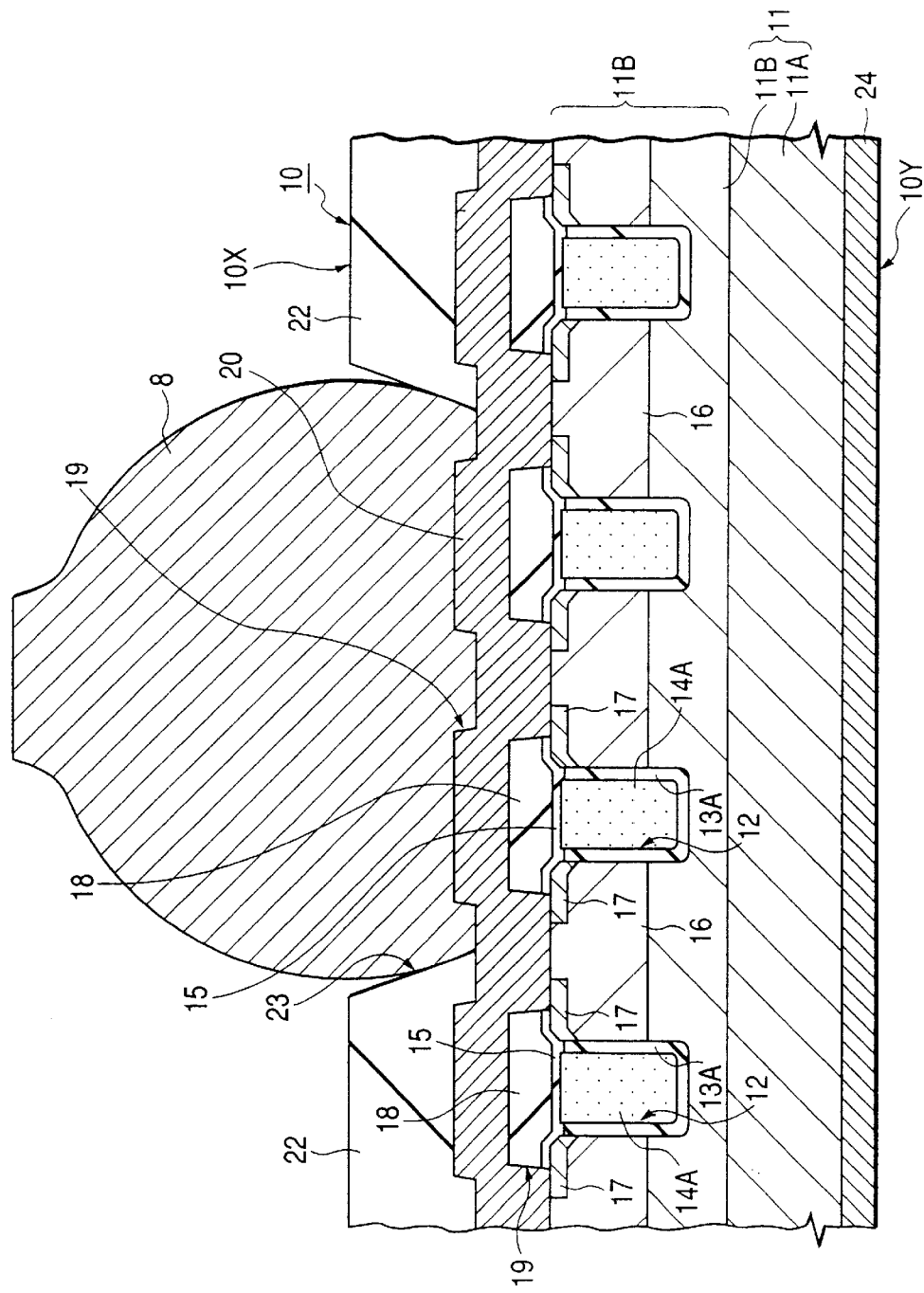
FIG. 7 is a typical cross-sectional view taken along line d—d of FIG. 5.
Figure 8:
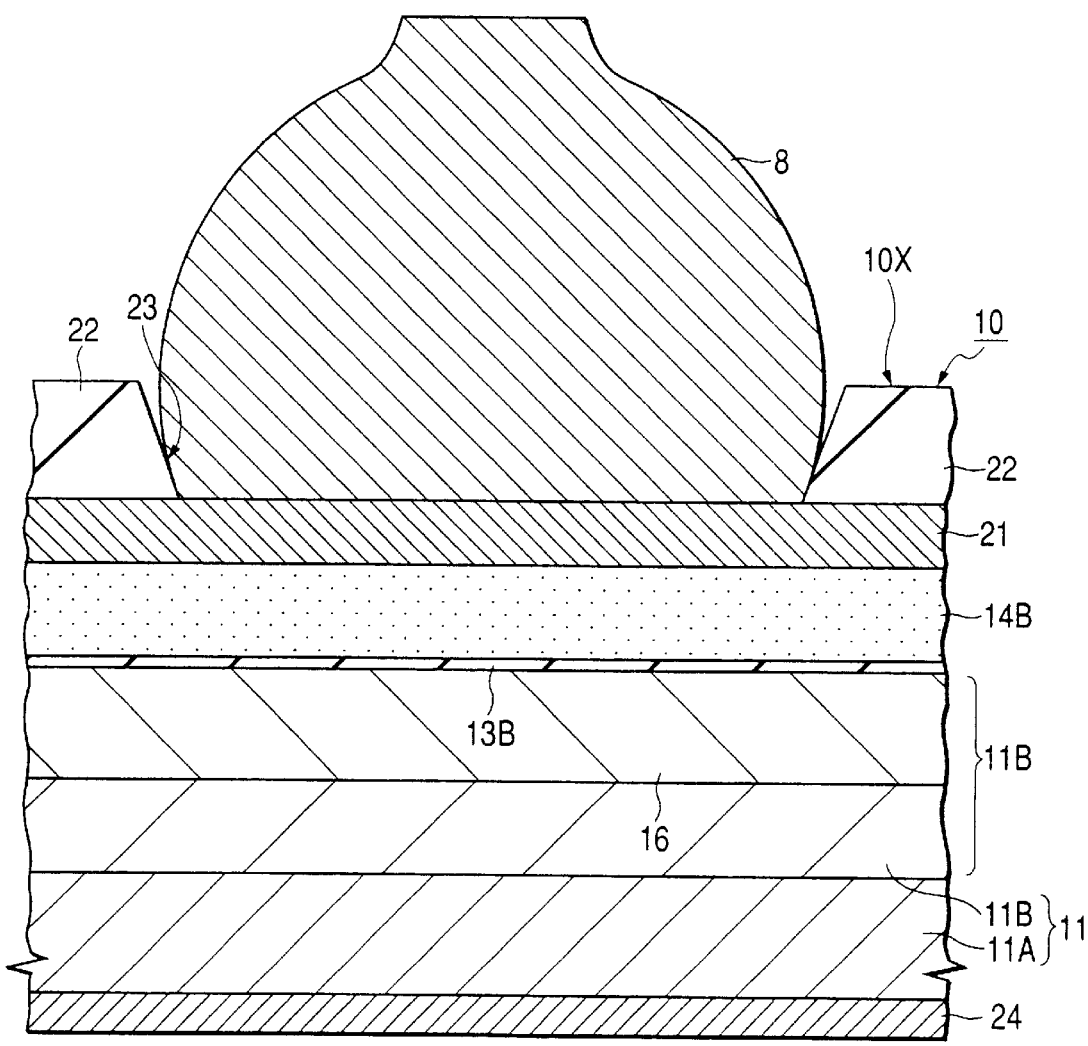
FIG. 8 is a typical cross-sectional view taken along line e—e of FIG. 5.
Figure 9:
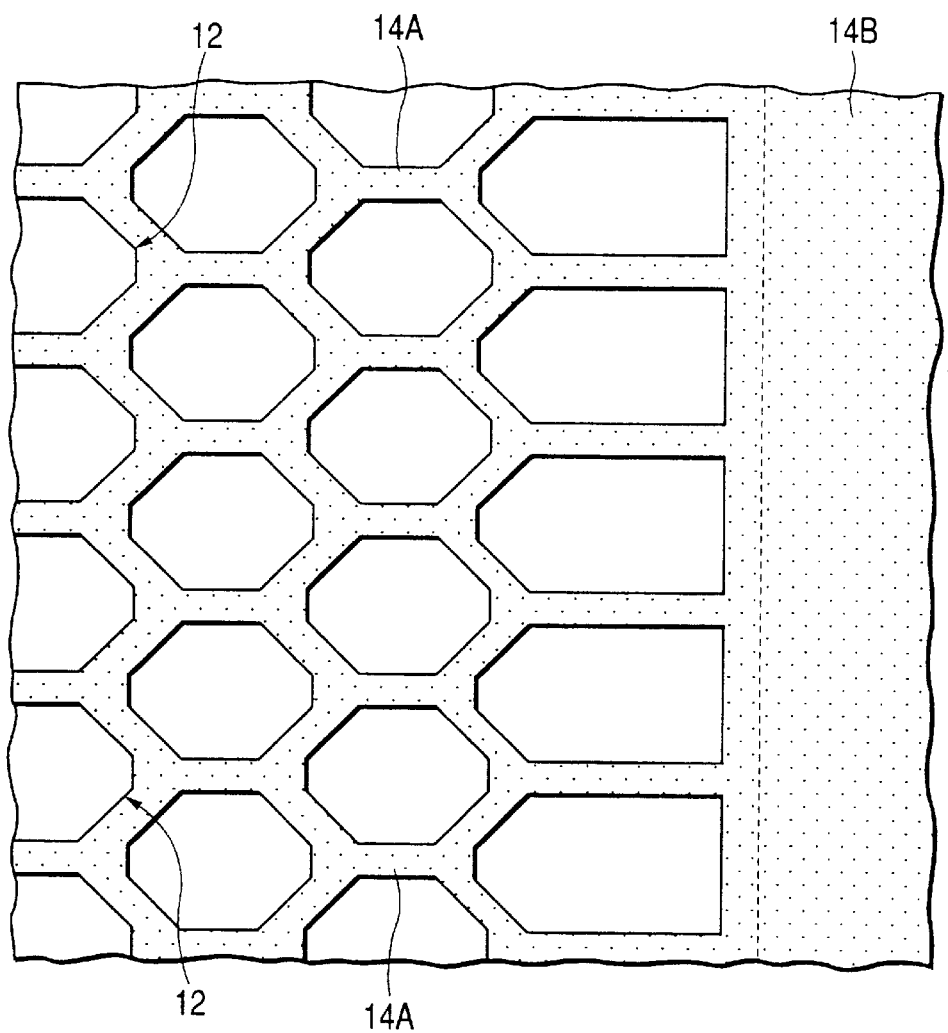
FIG. 9 is a typical plan view showing a plane pattern of a gate conductor layer shown in FIG. 8.

FIG. 1 is a typical perspective few showing a schematic configuration of a power transistor according to an embodiment 1 of the present invention, FIG. 2 is a typical cross-sectional view taken along line a—a of FIG. 1, FIG. 3 is a typical cross-sectional view taken along line b—b of FIG. 1, FIG. 4 is a typical cross-sectional view taken along line c—c of FIG. 1, FIGS. 5 and 6 are respectively a typical plan view and a typical bottom view each showing a schematic configuration of a semiconductor chip shown in FIG. 1, FIG. 7 is a typical cross-sectional view taken along line d—d of FIG. 5, FIG. 8 is a typical cross-sectional view taken along line e—e of FIG. 5, and FIG. 9 is a typical plan view showing a plane pattern of a gate conductor layer shown in FIG. 7, respectively.

As shown in FIGS. 1 through 3, a power transistor 1A according to the present embodiment principally has a lead 2, a lead 3, a plurality of projecting electrodes 8, an insulating sheet 9 and a semiconductor chip 10.

As shown in FIGS. 2 and 3, the semiconductor chip 10 has a source electrode 20 and a gate electrode 21 provided within an element forming surface (first main surface) 10X and includes a drain electrode 24 provided within the rear surface (second main surface) 10Y oppose to the element forming surface 10X. A flat or plane figuration or form of the semiconductor chip 10 is shaped in a square form as shown in FIGS. 5 and 6. In the present embodiment, the semiconductor chip 10 is shaped in the form of a rectangle of 3.9 [mm]×2.4 [mm], for example.

As shown in FIG. 7, the semiconductor chip 10 is comprised principally of a semiconductor substrate 11 in which an n− type semiconductor layer 11B comprised of monocystalline silicon is formed on a main surface of an n+ type semiconductor substrate 11A comprised of monocrystalline silicon, for example. For example, an n channel conduction type MOSFET (Metal Oxide Semiconductor Field Effect Transistor) of a vertical structure is formed within an element forming region (active region) lying within the main surface of the semiconductor substrate 11, as a transistor device.

Each MOSFET principally includes a channel forming region, a gate insulator 13A, a gate conductor layer 14A, and source and drain regions. The channel forming region comprises a p type well region 16 formed in the n− type semiconductor layer 11B. The source region is comprised of an n+ type semiconductor layer 17 formed within the p type well region 16. The drain region is comprised of the n− type semiconductor layer 11B and n+ type semiconductor substrate 11A. The gate insulator 13A is formed so as to extend along an inner surface of each groove or trench 12 extending in the direction from the main surface of the n− type semiconductor layer 11B to the depth thereof and is formed of, for example, a silicon oxide film. The gate conductor layer 14A is embedded inside each trench 12 through the gate insular so 13A and is comprised of a poly-crystalline silicon film in which an impurity for reducing a resistance value is introduced. That is, the MOSFET is comprised of a trench/gate type. Since the trench/gate type MOSFET can be reduced in occupied area as compared with MOSFET in which a gate conductor layer is formed on a main surface of a semiconductor substrate through a gate insulator, it is suitable for use in size reduction in cower transistor and reduction in on resistance.

The element forming region on the main surface of the n− type semiconductor layer 11B, which corresponds to the main surface of the semiconductor substrate 11, is divided into a plurality of island regions by the trenches 12. The plurality of island regions are respectively disposed regularly in matrix form and their plane forms are respectively shaped in a flat octagon. That is, the gate conductor layer 14A is formed in a mesh pattern, which surrounds the plurality of island regions divided by the trenches 12. Incidentally, the n+ type semiconductor region 17 corresponding to the source region is formed within main surfaces of the island regions divided by the trenches 12.

The n+ type semiconductor region 17 and p type well region 16 are respectively electrically connected to a source electrode 20 formed thereabove through apertures or openings 19 defined in an interlayer dielectric 18 as shown in FIG. 7. The interlayer dielectric 18 is provided between the gate conductor layer 14A and the source electrode 20 and isolates the gate conductor layer 14A from the source electrode 20. The source electrode 20 is formed of a metal film such as an aluminum (Al) film or an aluminum, alloy film. Incidentally, an insulating film 15 is formed between the gate conductor layer 14A and the interlayer dielectric 18.

As shown in FIGS. 8 and 9, the gate conductor layer 14A is formed integrally with a gate pull-out or drawing interconnection 14B formed on a peripheral region (inactive region) of the main surface of the n− type semiconductor layer 11B with an insulating film 13B interposed therebetween. Although the gate drawing interconnection 14B is not illustrated in detail, it is electrically connected to a gate electrode 21 formed thereabove through the openings defined in the interlayer dielectric 18. The gate electrode 21 is formed in the same layer as the source electrode 20, and the source electrode 20 and gate electrode 21 are respectively isolated from each other.

As shown in FIGS. 5, 7 and 8, the source electrode 20 and gate electrode 21 are respectively covered with a surface protective film 22 formed on these. A plurality of bonding openings 23 are defined in the surface protective film 22. A plurality of protecting electrodes 8 are respectively electrically and mechanically connected to the source electrode 20 and gate electrode 21 through the plurality of bonding openings 23. The surface protective film 22 is formed of a silicon oxide film, for example. Although not limited to the present protecting electrodes 8, for example, gold (Au) bumps are used as the projecting electrodes 8. The Au bumps can be formed by a ball-bonding method using Au wires and in which an ultrasonic vibration is used in combination with thermocompression. The Au bumps formed by the ball bonding method are firmly connected to their corresponding electrodes of the semiconductor chip.

Respective plane forms of the source electrode 20 and gate electrode 21 are respectively shaped in the form of the square as shown in FIG. 5. In the present embodiment, the source electrode 20 is shaped in the form of a rectangle of 3.1 [mm]×2.0 [mm], for example, whereas the gate electrode 21 is shaped in the form of a rectangle of 0.4 [mm]×0.6 [mm], for example. On the other hand, the drain electrode 24 is formed over the entire area of the rear surface 10Y of the semiconductor chip 10 as shown in FIG. 6. As shown in FIG. 7, the drain electrode 24 is formed on the rear surface opposite to the main surface of the n+ type semiconductor substrate 11A and electrically connected to the n+ type semiconductor substrate 11A. The drain electrode 24 is formed of an Au film, for example.

As shown in FIGS. 1 and 2, the lead 2 has a first portion 2A located on the source electrode 20 of the semiconductor chip 10 and a second portion 23 formed integrally with the first portion 2A and located outside one long side 10a of two long sides opposite to each other, of the semiconductor chip 10.

The first portion 2A of the lead 2 is formed in an area larger than the area of the source electrode 20 and disposed so as to cover the source electrode 20. In the present embodiment, the first portion 2A of the lead 2 is formed in a size of about 3.2 [mm]×2.6 [mm], for example.

The first portion 2A of the lead 2 is electrically and mechanically connected to the source electrode 20 of the semiconductor chip 10 with the plurality of projecting electrodes 8 interposed therebetween. Further, the first portion 2A is bonded and fixed to the element forming surface 10X of the semiconductor chip 10 with the insulating sheet 9 interposed therebetween. That is, the lead 2 is held firmly to the element forming surface 10X of the semiconductor chip 10 by the insulating sheet 9 and the projecting electrodes 8.

As shown in FIGS. 1 and 3, the lead 3 has a first portion 3A located on the gate electrode 21 of the semiconductor chip 10 and a second portion 3B formed integrally with the first portion 3A and positioned outside one long side 10a of the semiconductor chip 10.

The first portion 3A of the lead 3 is formed in an area larger than the area of the gate electrode 21 and disposed so as to cover the gate electrode 21. In the present embodiment, the first portion 3A of the lead 3 is formed in a size of about 0.5 [mm]×2.6 [mm], for example.

The first portion 3A of the lead 3 is electrically and mechanically connected to the gate electrode 21 of the semiconductor chip 10 with the plurality of projecting electrodes 8 interposed therebetween. Further, the first portion 3A is bonded and fixed to the element forming surface 10X of the semiconductor chip 10 with the insulating sheet 9 interposed therebetween. That is, the lead 3 is held firmly to the element forming surface 10X of the semiconductor chip 10 by the insulating sheet 9 and the projecting electrodes 8.

Electrical connections between the first portions (2A and 3B) of the leads 2 and 3 and the projecting electrodes 8 formed on the respective electrodes (source electrode 20 and gate electrode 21) of the semiconductor chip 10 are made by thermocompression. Each of the thermocompressed projecting electrodes 8 has a width $\phi$ of about 100 [$\mu m$] and a height 8h of about 50 [$\mu$], or example. The thicknessess (2t and 3t) of the leads 2 and 3 are respectively about 0.15 [mm], for example. The thickness 10t of the semiconductor chip 10 is about 0.3 [mm, for example.

As shown in FIGS. 1 through 3, the respective second portions (23 and 3B) of the leads 2 and 3 are bent so as to be positioned on the rear surface 10Y side of the semiconductor chip 10. In the present embodiment, the respective second portions (2B and 3B) of the leads 2 and 3 are formed so as to be bend in a gull-wing type corresponding to one lead figuration for surface mount.

Leading or tip portions (2B4 and 3B4) of the respective second portions (2B and 3B) of the leads 2 and 3 are disposed at substantially the same height as the rear surface 10Y of the semiconductor chip 10 as seen in a height direction 10S of the semiconductor chip 10.

The second portion 2B of the lead 2, which is formed so as to be bent in the gull-wing type, has a projecting part (shoulder part) 2B1 which projects or protrudes from the first portion 2A of the lead 2 to the outside of one long side 10a of the semiconductor chip 10, a transitional part 2B2 bent toward the rear surface 10Y side of the semiconductor chip 10 from the projecting part 2B1, and a mounting part (connecting part) 2B3 which extends in the same direction as the projecting part 2B1 as viewed from the transitional part 2B2.

The second portion 3B of the lead 3, which is formed so as to be bent in gull-wing type, has a projecting part 3B1, which protrudes from the first portion 3A of the lead 3 to the outside of one long side 10a of the semiconductor chip 10, a transitional part 3B2 bent toward the rear surface 10Y side of the semiconductor chip 10 from the projecting part 3B1, and a mounting part 3B3 which extends in the same direction as the projecting part 3B1 as viewed from the transitional part 3B2.

The insulating sheet 9 is disposed between the respective first portions (2A and 2B) of the leads 2 and 3 and the semiconductor chip 10 and covers the element forming surface 10X of the semiconductor chip 10 except for the region in which the plurality of projecting electrodes 8 are disposed. Although not limited to the present insulating sheet 9, for example, a resin sheet composed of an epoxy thermosetting resin not containing conductive particles is used as the insulating sheet 9. Upper surfaces (2AX and 3AX) of the respective first portions (2A and 3A) of the leads 2 and 3 are bare from the insulating sheet 9.

As shown in FIG. 1, the lead 2 is provided with slits 4A which extend toward the semiconductor chip 10 as viewed from the tip portion 2B4 of the second portion 2B. In the present embodiment, there are two slits 4A and each of them extends from the tip portion 2B4 of the second portion 2B to the projecting part 2B1.

As shown in FIGS. 1 and 4, the width 2W of the lead 2 is wider than the width 3W of the lead 3 for the purposes of a reduction in on resistance. In the present embodiment, the width 2W of the lead 2 is formed to about 3.2 [mm], for example and the width 3W of the lead 3 is formed to about 0.5 [mm], for example.

Incidentally, the first portion 2A of the lead 2 slightly protrudes outside one short side 10c of the two short sides opposite to each other, of the semiconductor chip 10 and outside the other long side 10b (see FIGS. 2 and 4). The first portion 3A of the lead 3 slightly protrudes outside the other short side 10d of the semiconductor chip 10 and outside the other long side 10b (see FIGS. 3 and 4). The insulating sheet 9 slightly protrudes outside the respective sides (10a, 10b, 10c and 10d) of the semiconductor chip 10.

Meanwhile, a surface mount type package needs to protect a semiconductor chip from environments and firmly hold leads. In the conventional package structure wherein the protection of the semiconductor chip and the holding of the leads are carried out by transfer molding (resin molding) as in the case of a TSSOP type, a resin passage for allowing a resin to flow into the element forming surface side and rear surface side of the semiconductor chip is needed when the transfer molding is made using the molding die. Therefore, the thickness of the entire package becomes thick by a thickness equivalent to the thickness of the resin passage.

In the power transistor 1A according to the present embodiment on the other hand, the semiconductor chip 10 is protected by the insulating sheet 9 for covering the element forming surface 10X. Further, the lead 2 and the lead 3 are maintained at the element forming surface 10X of the semiconductor chip 10 by the insulating sheet 9. Since the protection of the semiconductor chip 10 and the holding of the leads (2 and 3) thereof by the insulating sheet 9 are carried out, although they will be described in detail later, by thermocompression with the insulating sheet 9 interposed between the element forming surface 10X of the semiconductor chip 10 and the respective first portions (2A and 3A) of the leads 2 and 3 and the projecting electrodes 8 interposed between the electrodes (source electrode 20 and gate electrode 21) of the semiconductor chip 10 and the respective portions (2A and 3A) of the leads 2 and 3, it becomes unnecessary to provide the resin passage necessary for the conventional packa6 copege wherein the protection of the semiconductor chip and the holding of the leads are carried out by the transfer molding. Thus, the thickness of the entire package becomes thin by a thickness equivalent to the thickness of the resin passage. Since the electrical connections between the electrodes (source electrode 20 and gate electrode 21) of the semiconductor chip 10 and the respective first portions (2A and 3A) of the leads 2 and 3 are made by the projecting electrodes 8, the thickness of the entire package becomes thin as compared with the use of the conductive wires.

Since the semiconductor chip and inner lead portions of the leads are covered with a resin low in thermal conductivity in the conventional package structure wherein the semiconductor chip and the inner lead portions of the leads are sealed with a resin sealing body as in the TSSOP type, a heat radiation property for discharging or radiating heat produced in the semiconductor chip to the outside is low.

On the other hand, the sides and rear surface 10Y of the semiconductor chip 10, the upper surfaces (2X and 3AX) of the first portions (2A and 3A) of the leads (2 and 3) and the entire second portions (2B and 3B) are bared from the insulating sheet 9 in the power transistor 1A according to the present embodiment, a heat radiation property for radiating heat produced from the semiconductor chip 10 to the outside is high.

Since a conducting path between each electrode of the semiconductor chip and each of the leads becomes long in the conventional package structure wherein the electrodes on the element forming surface of the semiconductor chip and the leads are electrically connected to one another by conductive wires as in the case of the TSSOP type, this leads to a hindrance to a reduction in on resistance.

On the other hand, since the electrical connections between the electrodes (source electrode 20 and gate electrode 21) of the semiconductor chip 10 and the respective first portions (2A and 3A) of the leads 2 and 3 are made by the projecting electrodes 8 in the power transistor 1A according to the present embodiment, the conducting path between each of the electrodes (source electrode 20 and gate electrode 21) and each of the leads (2 and 3) becomes short. Accordingly, the on resistance of the power transistor 1A is lowered.

Figure 10:
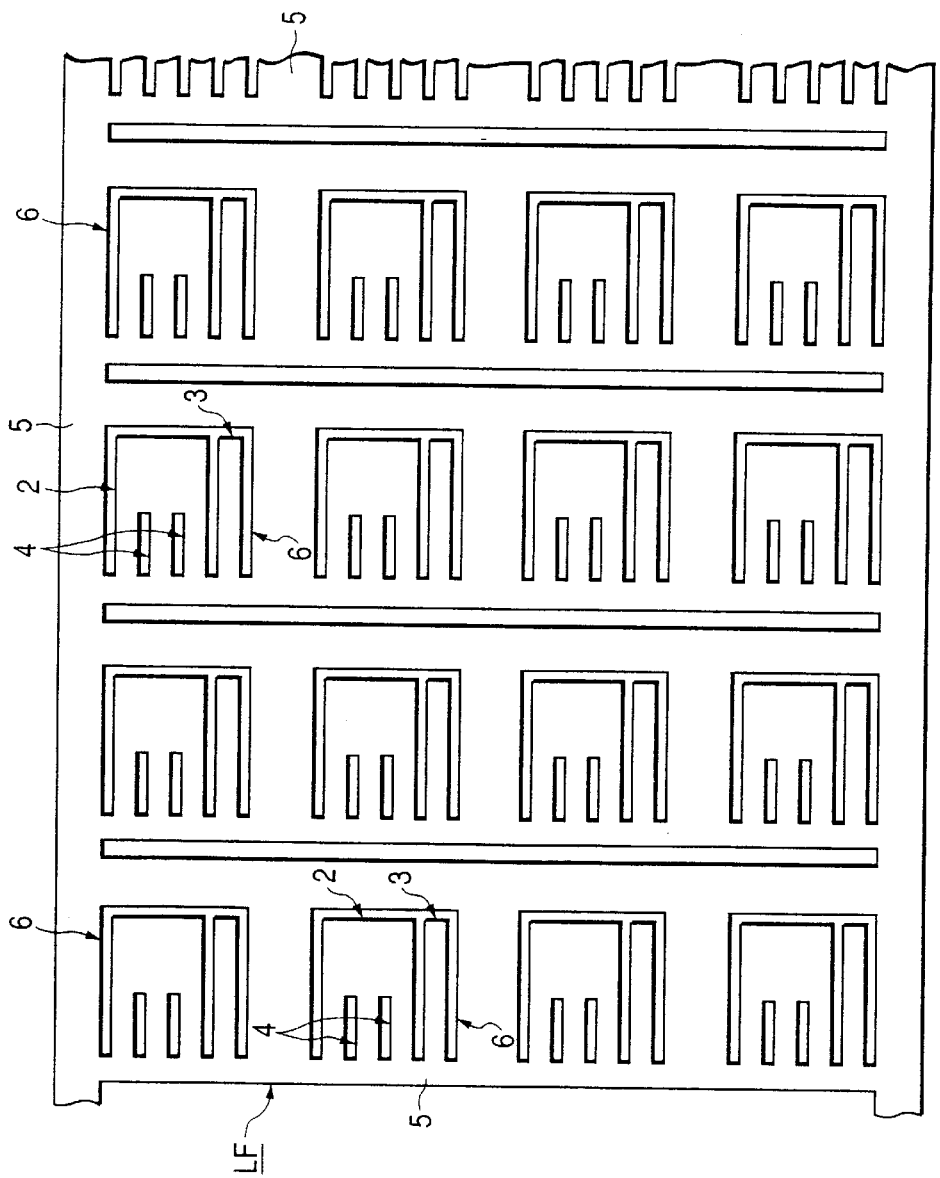
FIG. 10 is a typical plan view of a lead frame employed in the production of the power transistor shown in FIG. 11.

A lead frame used in the production of the power transistor 1A will next be described with reference to FIG. 10. FIG. 10 is a typical plan view showing a schematic configuration of a lead frame.

As shown in FIG. 10, a lead frame LF has a configuration wherein a plurality of lead placement or layout regions 6 defined in a frame body 5 are arranged in matrix form. leads 2 and 3 are disposed within the respective lead layout regions 6 respectively. The respective leads 2 and 3 are formed continuously or integrally with the frame body 5 and their second portions (2B and 3B) are coupled to the frame body 5. Each lead 2 is provided with two slits (4A).

The lead frame LF is formed by effecting etching processing or press working on a metal plate composed of copper (Cu) or a metal plate composed of a Cu alloy material, for example to thereby process predetermined lead patterns. The Cu or Cu alloy material is superior to an iron (Fe)-nickel (Ni) alloy material used as a material for the lead frame in conductivity and thermal conductivity.

A method of manufacturing the power transistor 1A will next be described with reference to FIGS. 11 through 14. FIGS. 11 through 14 are respectively typical cross-sectional views for describing a method of manufacturing a power transistor. Incidentally, a lead 3 is not illustrated in FIGS. 11 through 14.

The semiconductor chip 10 shown on FIGS. 5 and 6 and the lead frame LF shown in FIG. 10 are first prepared. A plurality of projecting electrodes 8 are formed on source and gate electrodes 20 and 21 of the semiconductor chip 10. It is desirable that the projecting electrodes 8 are formed before a semiconductor wafer is divided into each individual semiconductor chips, i.e., in a semiconductor wafer stage. This is because the processing becomes cumbersome since processing units swell into several hundred times as compared with the state of the wafer after the semiconductor wafer has been divided into each individual semiconductor chips, this exerts an influence on the quality and cost. Since the processing becomes cumbersome because the area of the plane figuration of the semiconductor chip is less than or equal to 10 [mm$^2$], this exerts an influence upon the quality and cost. The height of each pre-thermocompression projecting electrode 8 is about 60 [m].

Figure 11:
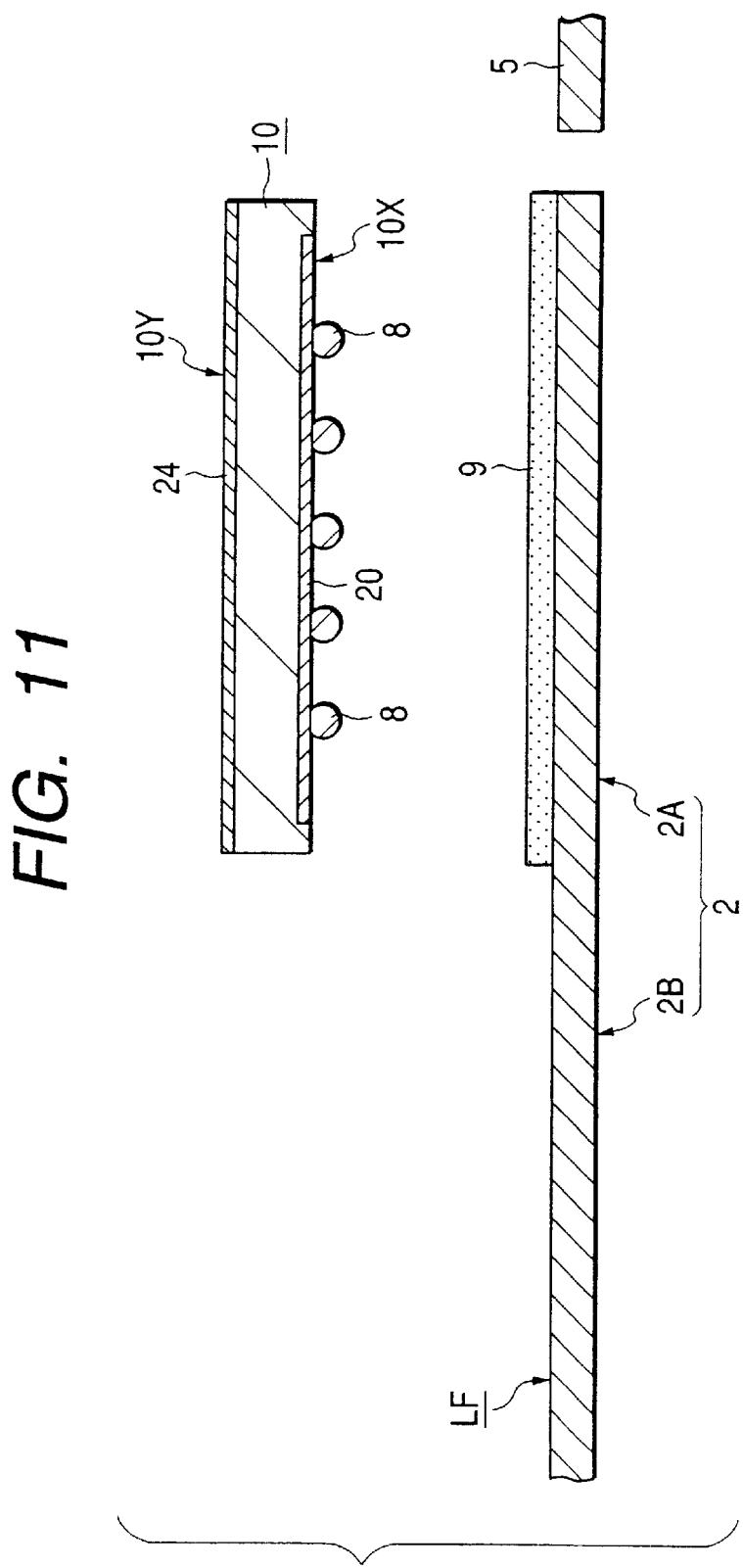
FIG. 11 is a typical cross-sectional view for describing the production of the power transistor shown

As shown in FIG. 11, an insulating sheet 9 is next placed on a first port on 2A of a lead 2 and a first portion 3A of a lead 3. A resin sheet composed of an epoxy thermosetting resin not containing conductive particles, for example is used as the insulating sheet 9. It is desirable that one having a plane size equivalent to that of the semiconductor chip or slightly larger than it is used as the insulating sheet 9. This is because even if a displacement in the position of the insulating sheet 9 and a displacement in the position of the semiconductor chip 10 occur, short circuits in the peripheral edges of the semiconductor chip 10 with respect to the leads (2 and 3) can be controlled. In the present embodiment, an insulating sheet 9 of 4.0 [mm]×2.5 [mm] was used. It is desirable that one equivalent to the height of each projecting electrode 8 or slightly thicker than it is used as the insulating sheet 9. This is because since the leading or tip portion of the projecting electrode 8 is crushed upon a bonding process for electrically connecting the electrodes (20 and 21) of the semiconductor chip 10 and the first portions (2A and 3A) of the leads (2 and 3), the amount of extrusion thereof from the semiconductor chip 10 increases when it is excessively made thick, thus leading to a failure in outward appearance. Excessively thinning it in reverse yields the factor that results in a defective condition that the strength of fixing of the leads (2 and 3) by the insulating sheet 9 becomes low so that the leads (2 and 3) peel off. In the present embodiment, an insulating sheet 9 having a thickness of about 60 [$\mu$m] is used because the height of the projecting electrode 8 is about 60 $\mu$m].

Next, the lead frame LF is mounted to a heat stage 30 and thereafter the semiconductor chip 10 is positioned and placed on the first portions (2A and 3A) of the leads 2 and 3. At this time, the semiconductor chip 10 is placed in a state in which an element forming surface 10 thereof faces the respective first portions (2A and 3A) of the leads 2 and 3.

Figure 12:
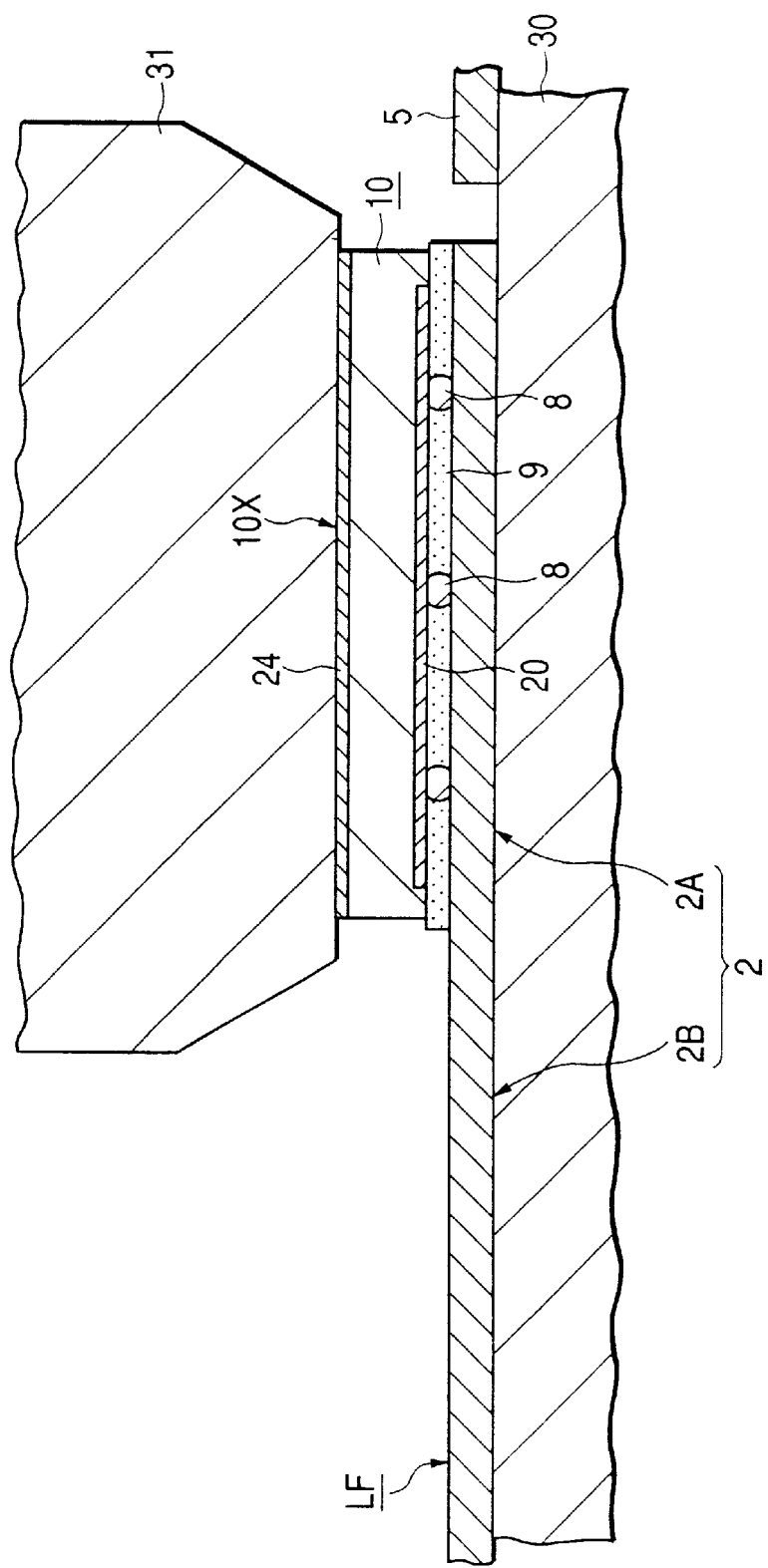
FIG. 12 is a typical cross-sectional view for describing the production of the power transistor shown in FIG. 1.

Next, as shown in FIG. 12, the heat stage 30 is pressed from the rear surface 10Y side of the semiconductor chip 10 by a bonding tool 31 in a state in which it is heated to about 200 [° C.]. Forces ranging from 50 [g] to 500 [g] per projecting electrode carry out the pressing thereof by the bonding tool 31. At this time, the insulating sheet 9 is temporarily melted by heat applied from the heat stage 30 and thereafter cured. On the other hand, since the projecting electrodes 8 are respectively spherical in shape, they make contact with the respective first portions (2A and 3A) of the leads 2 and 3 without snapping the melted insulating sheet 9 therebetween, and the tip portions of the projecting electrodes 8 are crushed so that satisfactory bonding is achieved.

In the present process, the element forming surface 10X of the semiconductor chip 10 is covered with an insulating sheet 8 except for a region in which the plurality of projecting electrodes 8 are disposed. Further, the respective first portions (2A and 3A) of the leads 2 and 3 are bonded and fixed to the element forming surface 10X by the insulating sheet 9. That is, the element forming surface 10X of the semiconductor chip 10 is protected by the insulating sheet 9, and the leads 2 and 3 are held firmly to the semiconductor chip 10 by the insulating sheet 9.

Next, bake processing is performed to cure the insulating film 8. The bake processing is carried out for about 30 minutes in an atmosphere of a temperature of about 180 [° C.].

Figure 13:
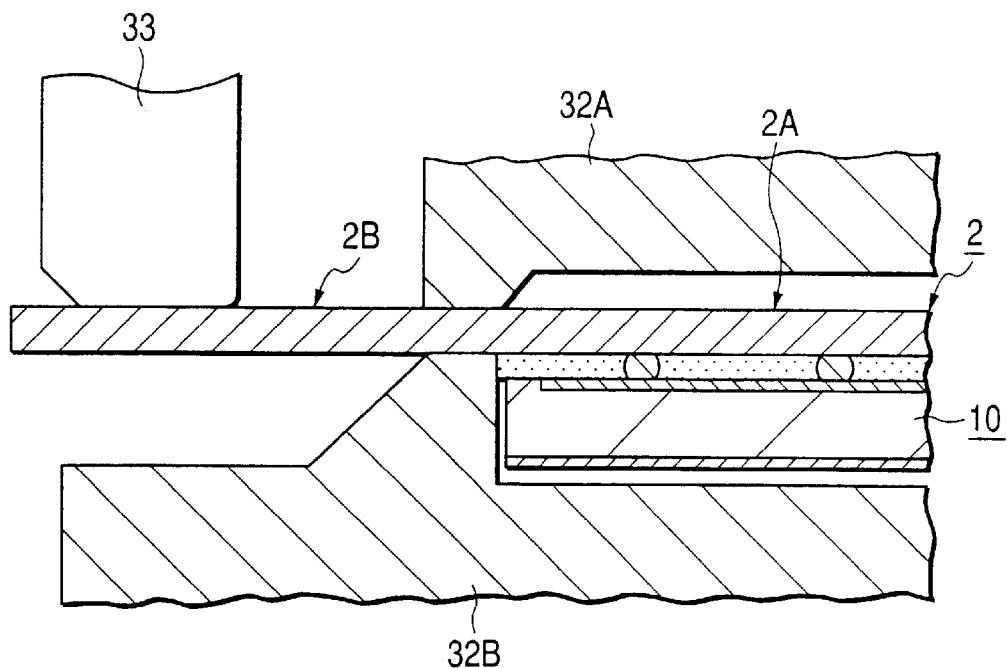
FIG. 13 is a typical cross-sectional view for describing the production of the power transistor shown in FIG. 1.
Figure 14:
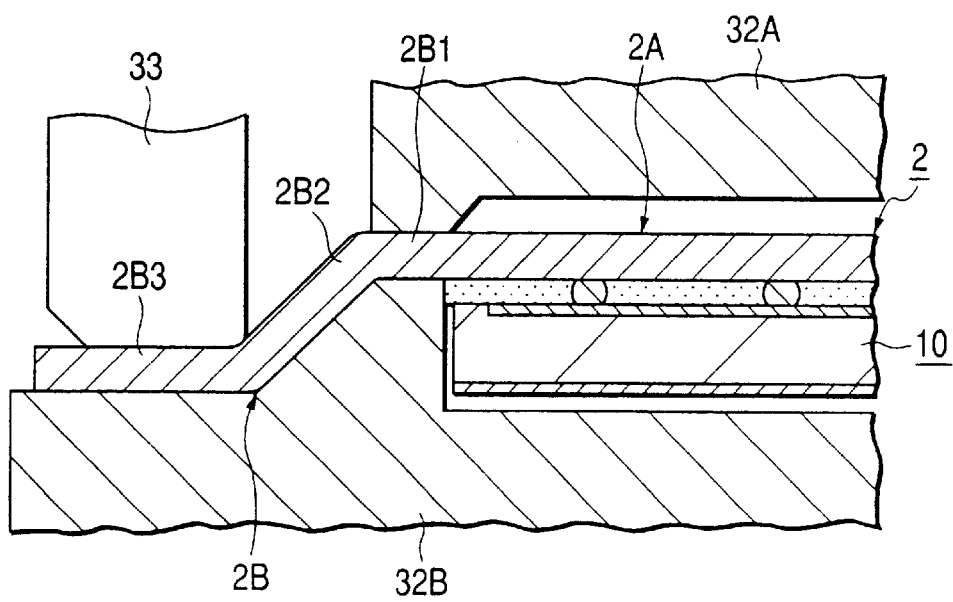
FIG. 14 is a typical cross-sectional view for describing the production of the power transistor shown in FIG. 1.

Next, the leads 2 and 3 are cut from a frame body 5 of the lead frame LF. Thereafter, second portions (2B and 3B) of the leads 2 and 3 are formed so as to be bent in a gull-wing type. Bending molding is carried out by first clamping protecting parts (2B1 and 3B1) of the second portions (2B and 3B) of the leads 2 and 3 by a lead holding member 32A and a bending table 32B and thereafter allowing a bending punch 33 to make contact with mounting parts (2B3 and 3B3) of the respective second portions of the leads 2 and 3, as shown in FIG. 13, and diagonally moving the bending punch 33 toward a projecting part of the bending table 32B as shown in FIG. 14.

In the present process, a width 2W of the lead 2 is broader than a width 3W of the lead 3 to achieve a reduction in on resistance. Therefore, the degree or difficulty in bending and forming the lead 2 is higher than that for the lead 3. However, since the second portion 2B of the lead 2 is provided with two slits 4A which extend from its tip portion 2B4 to the projecting part 2B1 toward the semiconductor chip 10, the degree of difficulty in bending and forming can be lowered.

Thereafter, a cutting process for aligning the tip positions of the second portions (2B and 3B) of the leads 2 and 3 with each other is effected, so that the power transistor 1A according to the present embodiment is substantially completed.

Figure 15:
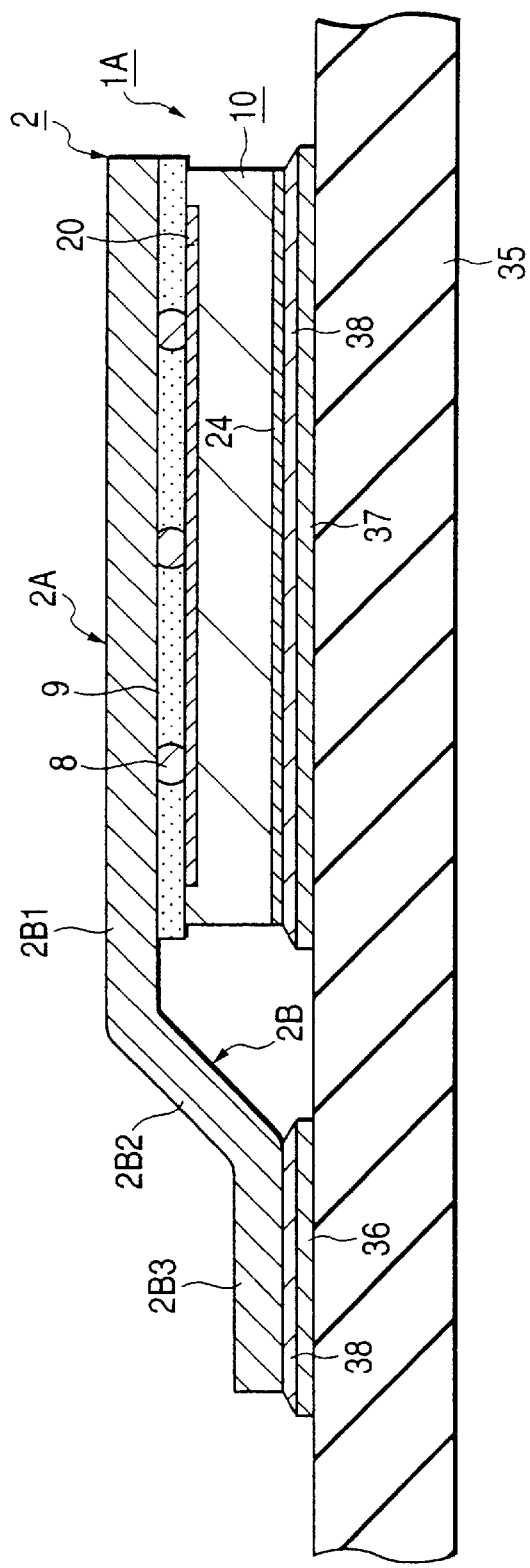
FIG. 15 is a typical cross-sectional view showing a state in which the power transistor shown in FIG. 1 is implemented on a printed circuit board.

The power transistor 1A formed in this way is implemented on a mounting substrate or printed circuit board 35 as shown in FIG. 15 (corresponding to a typical cross-sectional view showing a state in which it is mounted on the printed circuit board). The mounting parts (2B3 and 3B3) of the leads (2 and 3) are respectively electrically and mechanically connected to their lead connecting terminals (parts of wires or interconnections) of the printed circuit board 35 by a conductive adhesive (conductive material having Pb—Sn composition, for example). A drain electrode 24 or the rear surface 10Y of the semiconductor chip 10 is electrically and mechanically connected to a chip connecting terminal (part of interconnection) 37 of the printed circuit board 35 by the adhesive 38.

Although the mounting of the power transistor 1 is not limited to this, for example, a paste-like adhesive is formed on each lead connecting terminal 36 and the chip connecting terminal 37 of the printed circuit board 35, thereafter the mounting parts (2B3 and 3B3) of the leads (2 and 3) are disposed with the adhesive being placed on each lead connecting terminal 30, the drain electrode 24 on the rear surface 10Y of the semiconductor chip 10 is placed with the adhesive being placed on the chip connecting terminal 37, thereafter the printed circuit board 35 is fed to an infrared reflow furnace, where the adhesive is thereafter melted and cured. Thus, the power transistor 1A is mounted on the printed circuit board 35.

In the process for mounting the power transistor 1A, the second portions (2B and 3B) of the leads (2 and 3) are formed so as to be bent in a gull-wing type corresponding to one lead figuration for surface mount. Thus, stress produced due to thermal expansion at the time of the mounting of the power resistor 1A to the printed circuit board 35 can be relaxed by elastic deformation or the second portions (2B and 3B) of the leads (2 and 3). Further, stress developed due to warpage of the post-mounting printed circuit board 35 can be also relaxed.

Figure 16:
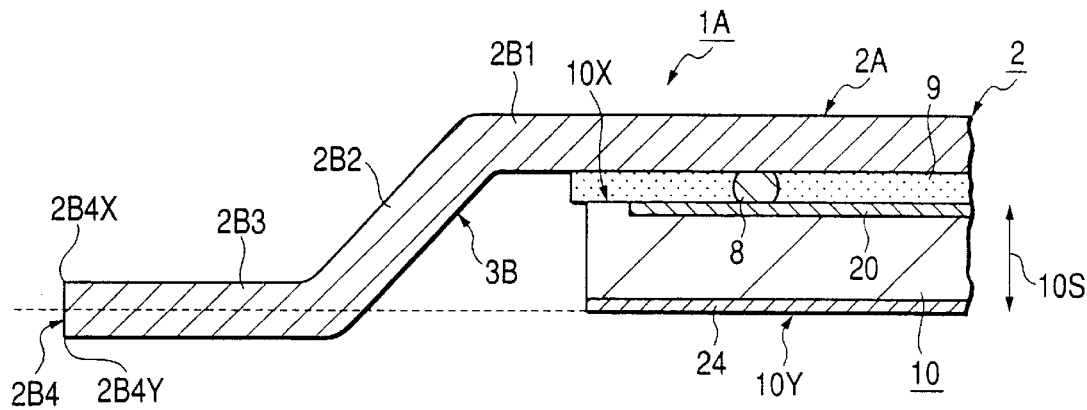
FIG. 16 is a typical cross-sectional view for describing a tip position of a lead shown in FIG. 1.
Figure 17:
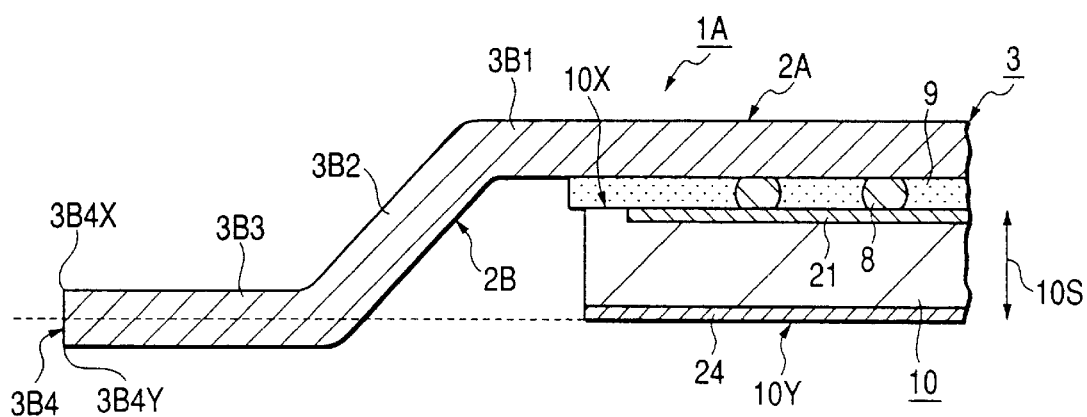
FIG. 17 is a typical cross-sectional view for describing a tip position of a lead shown in FIG. 1.
Figure 18:
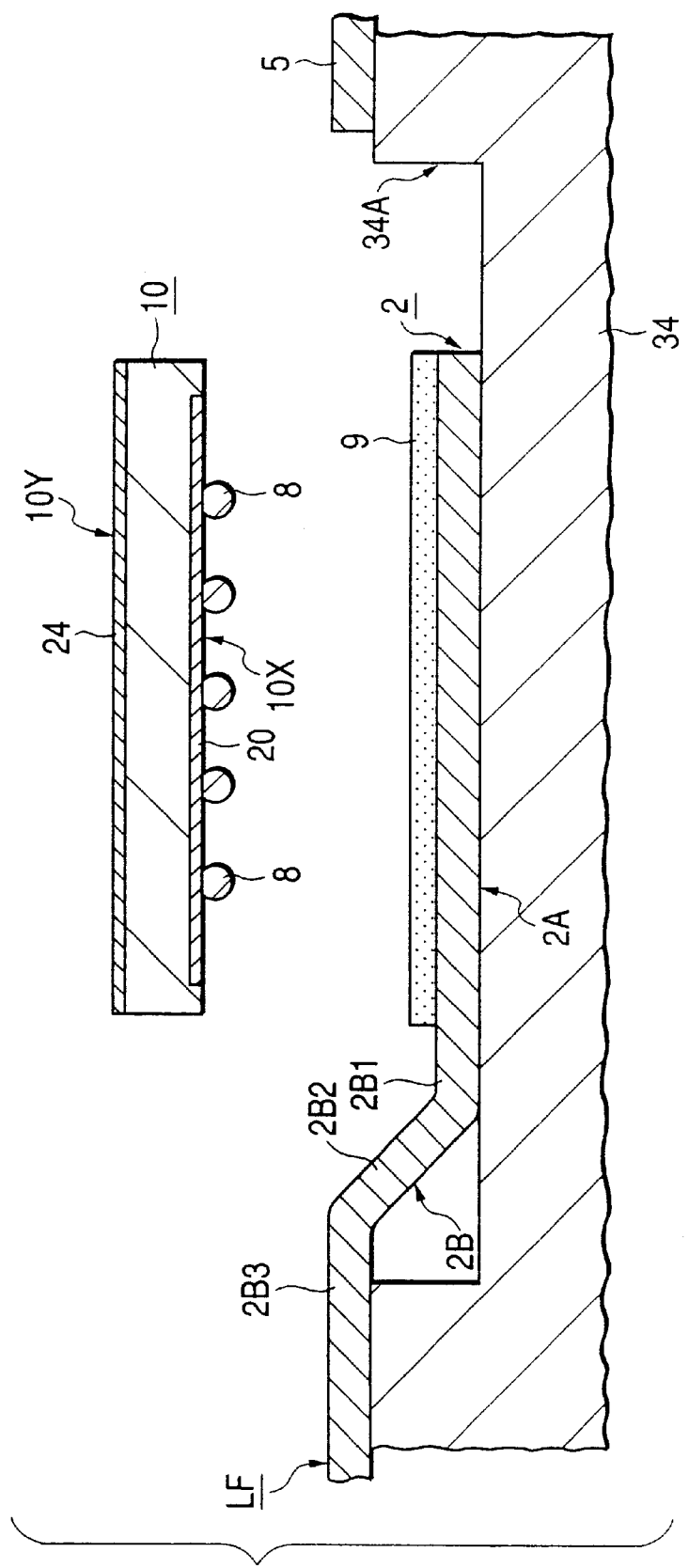
FIG. 18 is a typical cross-sectional view for describing another production of the power transistor shown in FIG. 1.

Incidentally, the power transistor 1A according to the present embodiment is formed so that the drain electrode 24 of the rear surface 10Y of the semiconductor chip is joined to its corresponding chip connecting terminal 37 on the printed circuit board 35 with the adhesive 38 interposed therebetween. It is thus desirable that as shown in FIGS. 16 and 17 (corresponding to typical cross-sectional views for describing tip positions of leads), upper edge portions (2B4X and 3B4X) of the tip portions (2B4 and 3B4) of the respective second portions (2B and 3B) of the leads 2 and 3 are respectively disposed at heights higher than the rear surface 10Y of the semiconductor chip as viewed in a thickness direction 10S of the semiconductor chip 10 and lower edge portions (2B4Y and 3B4Y) of the tip portions (2B4 and 3B4) thereof are respectively disposed at heights lower than the rear surface 10Y of the semiconductor chip as viewed in the thickness direction 10S thereof.

According to the present embodiment as described above, the following effects can be obtained.

[1] A power transistor 1A comprises:

a semiconductor chip 10 having a source electrode 20 and a gate electrode 21 formed in an element forming surface 10X and a drain electrode 24 formed in a rear surface 10Y;

a lead 2 having a first portion 2A located on the source electrode 20 and a second portion 2B formed integrally with the first portion 2A and located outside one long side 10a of the semiconductor chip 10;

a lead 3 having a first portion 3A located on the gate electrode 21 and a second portion formed integrally with the first portion 3A and located outside one long side 10a of the semiconductor chip 10;

a plurality of projecting electrodes 8 which are placed between the first portion 2A of the lead 2 and the source electrode 20 and between the first portion 3A of the lead 3 and the gate electrode 21 and electrically connect them to one another; and an insulating sheet 9, which is placed between the first portion 2A of the lead 2 and the element forming surface 10X of the semiconductor chip 10 and between the first portion 3A of the lead 3 and the element forming surface 10X of the semiconductor chip 10 and which covers the element forming surface 10X of the semiconductor chip 10 other than the region in which the plurality of projecting electrodes 8 are placed.

Since the resin passage for allowing the resin to flow into the element forming surface 10X side and the rear surface 10Y side of the semiconductor chip 10 is unnecessary owing to such a configuration, the thickness of the entire package becomes thin by a thickness equivalent to the thickness of the resin passage. Further, since the electrical connections between the electrodes (source electrode 20 and gate electrode 21) of the semiconductor chip 10 and the respective first portions (2A and 3A) of the leads 2 and 3 are made by the projecting electrodes 8, the thickness of the entire package becomes thin as compared with the use of the conductive wires. As a result, the power transistor 1A can be made thin.

Since the sides and rear surface 10Y of the semiconductor chip 10, the upper surfaces (2X and 3AX) of the first portions (2A and 3A) of the leads (2 and 3), and the entire second portions (2B and 3B) thereof are exposed from the insulating sheet 9, an improvement in heat radiation property for radiating or discharging heat generated from the semiconductor chip 10 to the outside can be achieved.

Since the electrical connection between the electrodes (source electrode 20 and gate electrode 21) of the semiconductor chip 10 and the respective first portions (2A and 3A) of the leads 2 and 3 are carried out by the projecting electrodes 8, a conducting path between each of the electrodes (source electrode 20 and gate electrode 21) of the semiconductor chip 10 and each of the leads (2 and 3) becomes short. As a result, a reduction in on resistance of the power transistor 1A can be achieved.

[2] A width 2W of the lead 2 is formed so as to be broader than a width 3W of the lead. The lead 2 is provided with two slits 4A which extend from a tip portion 2B4 of the second portion 2B to a projecting part 2B1 toward the semiconductor chip 10.

Since the degree of difficulty in bending and forming the second portion 2B of the lead 2 can be lowered owing to such a configuration even if the width 2W of the lead 2 is widened to improve a reduction in on resistance and heat radiation property productivity in the lead bending process can be improved.

[3] The respective second portions (2B and 3B) of the leads 2 and 3 are bent and formed in a gull-wing type.

Owing to such a configuration, stress produced due to thermal expansion at the time of the mounting of the power transistor 1A to a printed circuit board 35 can be relaxed by elastic deformation of the second portions (23 and 33) of the leads (2 and 3). Further, stress developed due to warpage of the post-mounting printed circuit board 35 can be also relaxed. Therefore, a breakdown in the projecting electrodes 8, which is produced due to the concentration of the stress on the projecting electrodes 8, can be restrained from occurring. As a result, the reliability of the power transistor 1A with respect to the mounting can be enhanced.

Since the printed circuit board incorporated into small electronic equipment such as a portable telephone, a portable information processing terminal, a portable personal computer or the like is thin or reduced in thickness and easy to warp in particular, it is important to relax the stress due to the warpage of the printed circuit board by elastic deformation.

Incidentally, the present embodiment has described the example in which the bending and formation or the second portions (2B and 3B) of the leads (2 and 3) are carried out after the mounting of the semiconductor chip 10 to the leads (2 and 3). However, the second portions (2B and 3B) of the leads (2 and 3) may be bent and formed before the mounting of the semiconductor chip 10 to the leads (2 and 3). Since the breakage or the like of the semiconductor chip 10, which occurs in the bending process, can be substantially eliminated in this case, the yield of the power transistor 1A can be improved.

While the present embodiment has described the example in which the insulating sheet 9 is bonded to the leads (2 and 3), the insulating sheet 9 may be placed on the semiconductor chip 10.

While the present embodiment has described the example in which the two slits 4A are provided, the present invention is not limited to this and one or three or more may be provided. It is however necessary to determine the number of the slits 4A in consideration of the on resistance, thermal resistance and the degree of difficulty in bending a forming or the like.

While the present embodiment has explained the example in which the Au bumps are used as the projecting electrodes 8, another material (e.g., solder material) may be used. Alternatively, one formed by another method (e.g., vapor deposition method, a ball supply method or the like) may be used.

While the present embodiment has described the example in which the resin sheet composed of the epoxy thermosetting resin not containing the conductive particles is used as the insulating sheet 9, one comprised of another material (e.g., polyimide thermoplastic resin) may be used.

Figure 19:
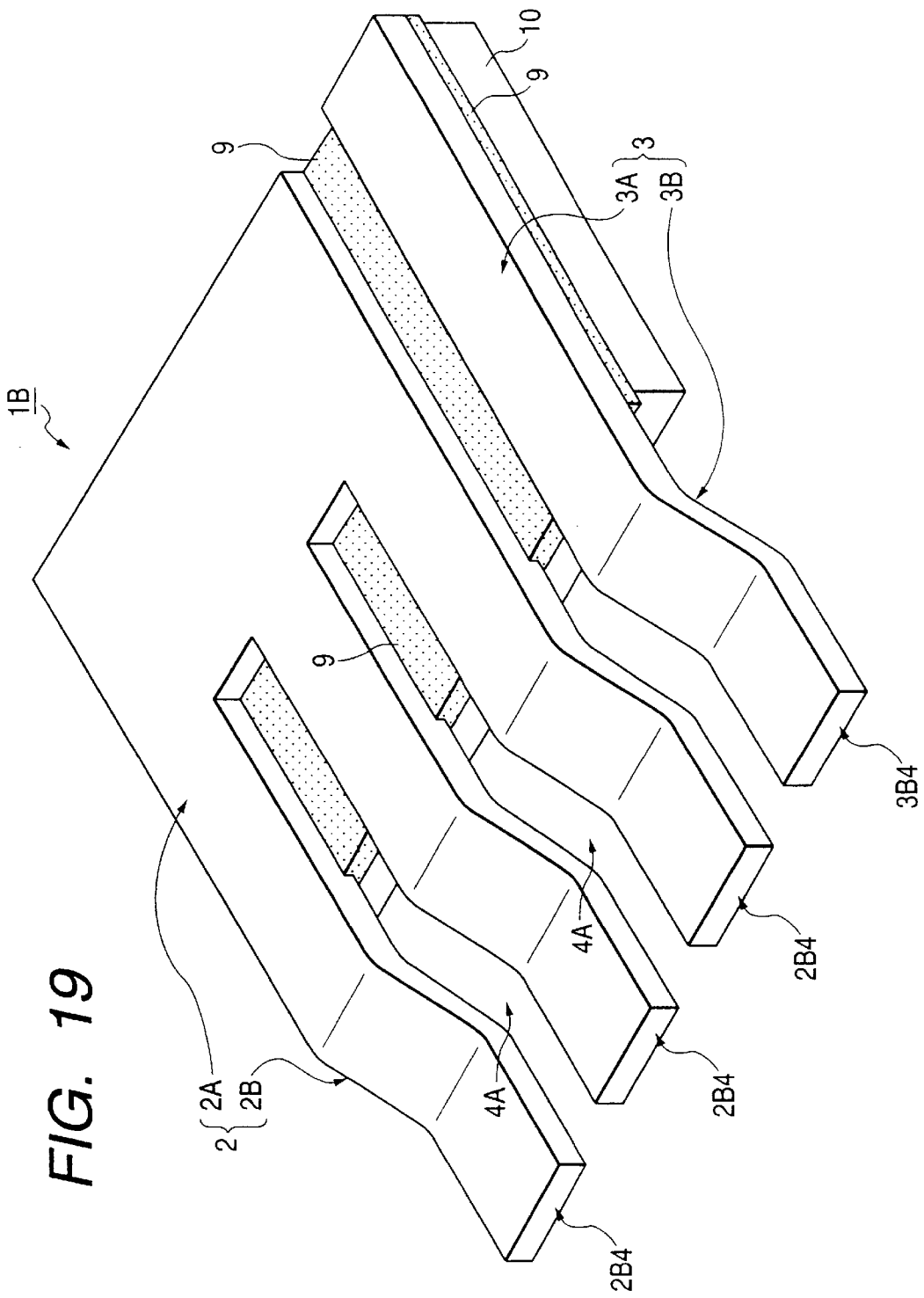
FIG. 19 is a typical perspective view showing a schematic configuration of a power transistor according to an embodiment 2 of the present invention.

(Embodiment 2):

FIG. 19 is a typical perspective view showing a schematic configuration of a power transistor according to an embodiment of the present invention.

As shown in FIG. 19, the power transistor 1B according to the present embodiment is basically configured in a manner similar to the aforementioned embodiment 1 and different therefrom in the following configuration.

That is, two slits 4A defined in a lead 2 extend from a tip portion 2B4 of the lead 2 to a first portion 2A of the lead 2. Since air drawn when the first portion 2A of the lead 2 is mounted to an element forming surface 10X of a semiconductor chip 10 and gas developed from an insulating sheet 9 are easy to escape owing to such a configuration, voids can be restrained from occurring. However, the present embodiment is reduced in heat radiation property as compared with the aforementioned embodiment 1.

Figure 20:
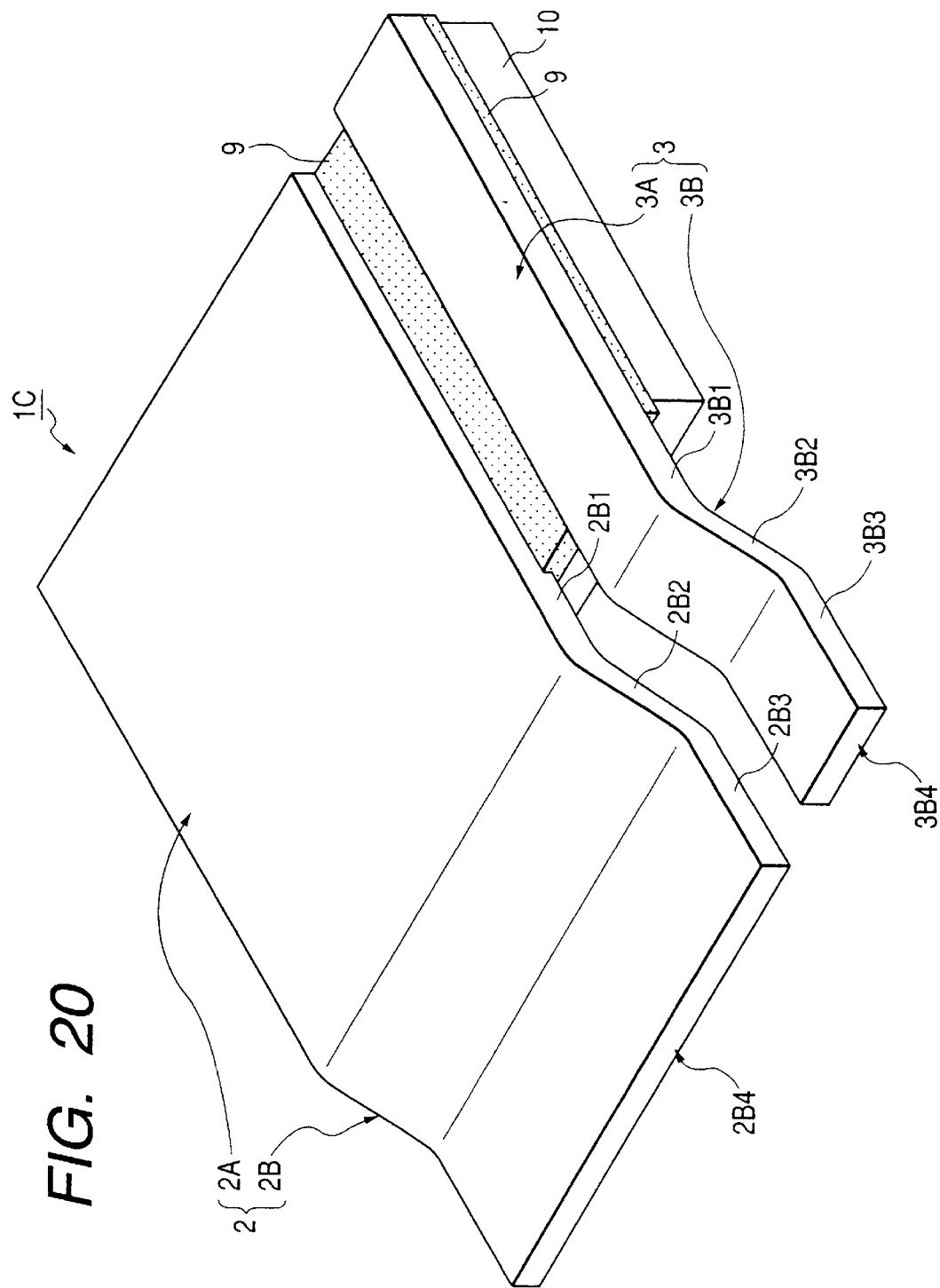
FIG. 20 is a typical perspective view illustrating a schematic configuration of a power transistor according to an embodiment 3 of the present invention.

(Embodiment 3):

FIG. 20 is a typical perspective view showing a schematic configuration of a power transistor according to an embodiment 3 of the present invention.

As shown in FIG. 20, a power transistor IC according to the present embodiment has basically configured in a manner similar to the aforementioned embodiment 1 and different therefrom in the following configuration.

That is, no slits 4A are defined in a lead 2. Owing to such a configuration, the area in which the lead 2 contacts outside air, increases and the electrical resistance of from a first portion 2A of the lead 2 to a mounting part 2B3 of a second portion 2B becomes low. Therefore, an improvement in heat radiation property and a reduction in on resistance can be further achieved as compared with the aforementioned embodiments 1 and 2. Since, however, the second portion 23 of the lead 2 becomes high in rigidity, the degree of difficulty in bending and forming the lead 2 becomes high. Further, the absorption of stress developed due to elastic deformation of the lead 2 is reduced.

Figure 21:
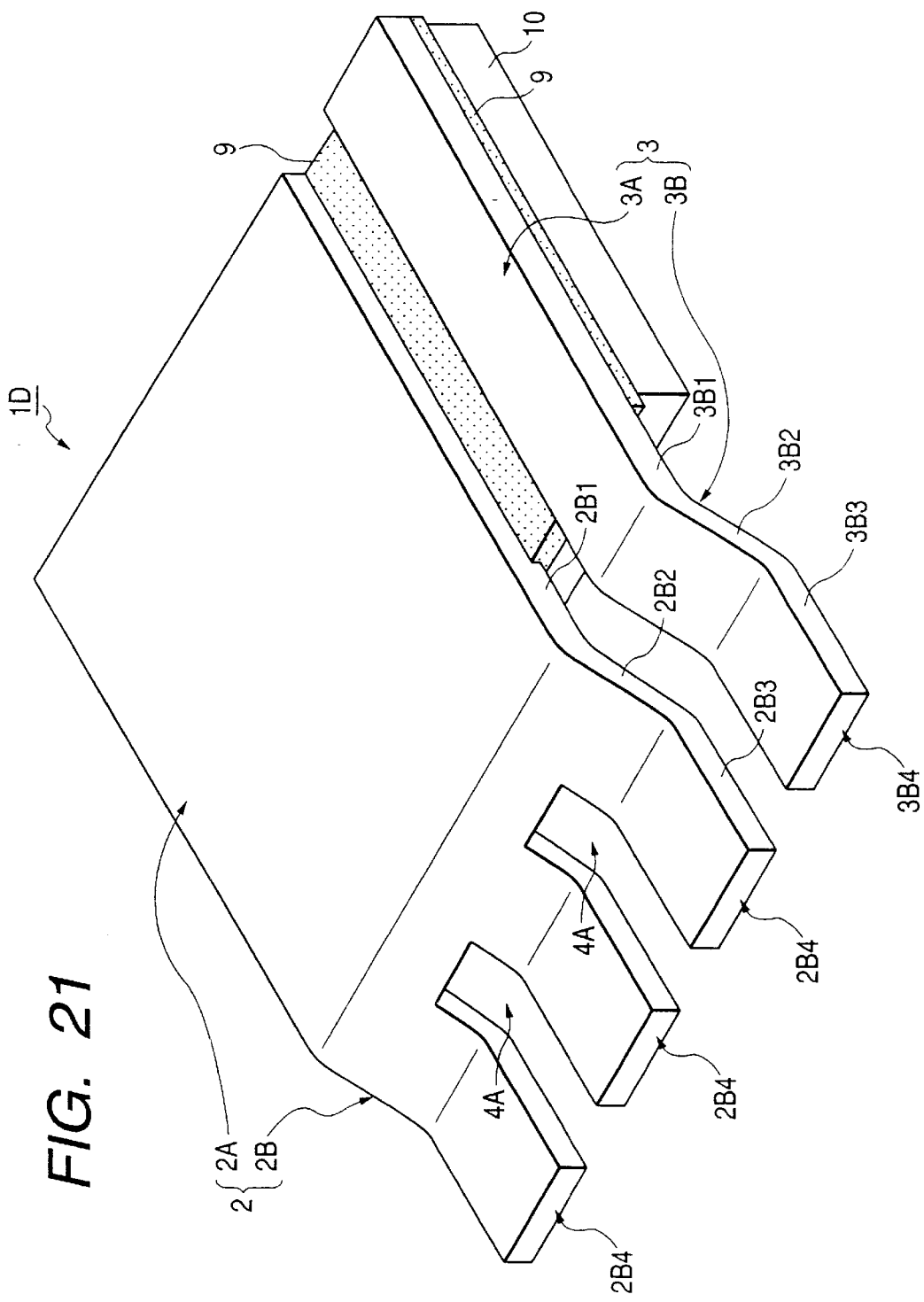
FIG. 21 is a typical perspective view showing a schematic configuration of a power transistor according to an embodiment 4 of the present invention.

(Embodiment 4):

FIG. 21 is a typical perspective view showing a schematic configuration of a power transistor according to an embodiment 4 of the present invention.

As shown in FIG. 21, a power transistor ID according to the present embodiment is basically configured in a manner similar to the aforementioned embodiment 1 and different therefrom in the following configuration.

That is, two slits 4A defined in a lead 2 extend from a tip portion 2B4 of a second portion 2A of the lead 2 to a transitional part 2B2 thereof. Owing to such a configuration, a heat radiation property and an on resistance similar to those obtained in the aforementioned embodiment 3 can be obtained, and the bending and formation of the lead 2 and the absorption of stress developed due to elastic deformation of the lead 2 can be carried out with the degree of difficulty similar to the aforementioned embodiments 1 and 2.

Figure 22:
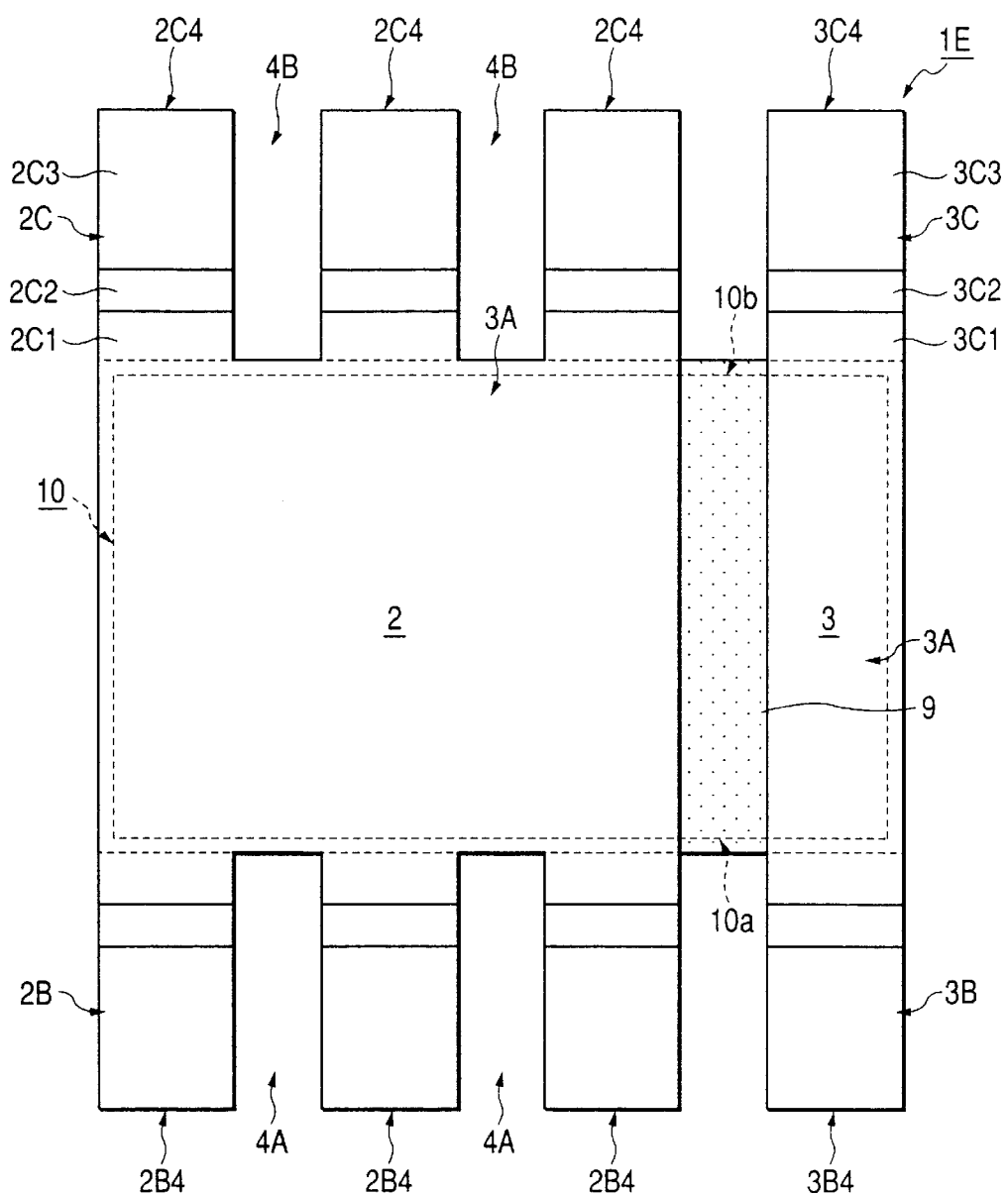
FIG. 22 is a typical perspective view depicting a schematic configuration of a power transistor according to an embodiment 5 of the present invention.

(Embodiment 5):

FIG. 22 is a typical perspective view showing a schematic configuration of a power transistor according to an embodiment 5 of the present invention.

As shown in FIG. 22, a power transistor IE according to the present embodiment is basically configured in a manner similar to the aforementioned embodiment 1 and different therefrom in the following configuration.

That is, a lead 2 has a first potion 2A and a second portion 2B and further has a third portion 2C formed integrally with the first portion 2A and located outside the other long side 10b of the semiconductor chip 10. In a manner similar to the second portion 2B, the third portion 2C of the lead 2 includes projecting parts 2C1 each of which projects from the first portion 2A to the outside of the other long side 10b of the semiconductor chip 10, transitional parts 2C2 each bent toward the rear surface 10Y of the semiconductor chip 10 as viewed from the projecting part 2C1, and mounting parts 2C3 each of which extends in the same direction as the projecting part 2C1 from the transitional part 2C2.

A lead 3 has a first portion 3A and a second portion 3B and further includes a third portion 3C formed integrally with the first portion 3A and located outside the other long side 10b of the semiconductor chip 10. In a manner similar to the second portion 3B, the third portion 3C of the lead 3 has a projecting part 3C1 which protrudes from the first portion 3A to the outside of the other long side 10b of the semiconductor chip 10, a transitional part 3C2 bent toward the rear surface 10Y of the semiconductor chip 10 as viewed from the projecting part 3C1, and a mounting part 3C3 which extends in the same manner as the projecting part 3C1 as viewed from the transitional part 3C2.

In a manner similar to the second portion 2B, the third portion 2C of the lead 2 is provided with two slits 43 each extending from a tip portion 2C4 of the third portion 2C to the projecting part 2C1 toward the semiconductor chip 10.

Owing to such a configuration, the area in which each of the lead 2 and the lead 3 contacts outside air, increases and the area in which each of the leads 2 and 3 and a printed circuit board are joined to each other, increases therefore, a heat radiation property is enhanced as compared with the aforementioned embodiment 1. Since the conducting path extending from the lead 2 to the printed circuit board reaches twice as compared with the above-described embodiment 1, a reduction in on resistance can be achieved as compared with the embodiment 1. However, the occupied area of the power transistor increases. Incidentally, numeral 3C4 shown in the same drawing is a tip portion of the third portion 3C of the lead 3.

Figure 23A:
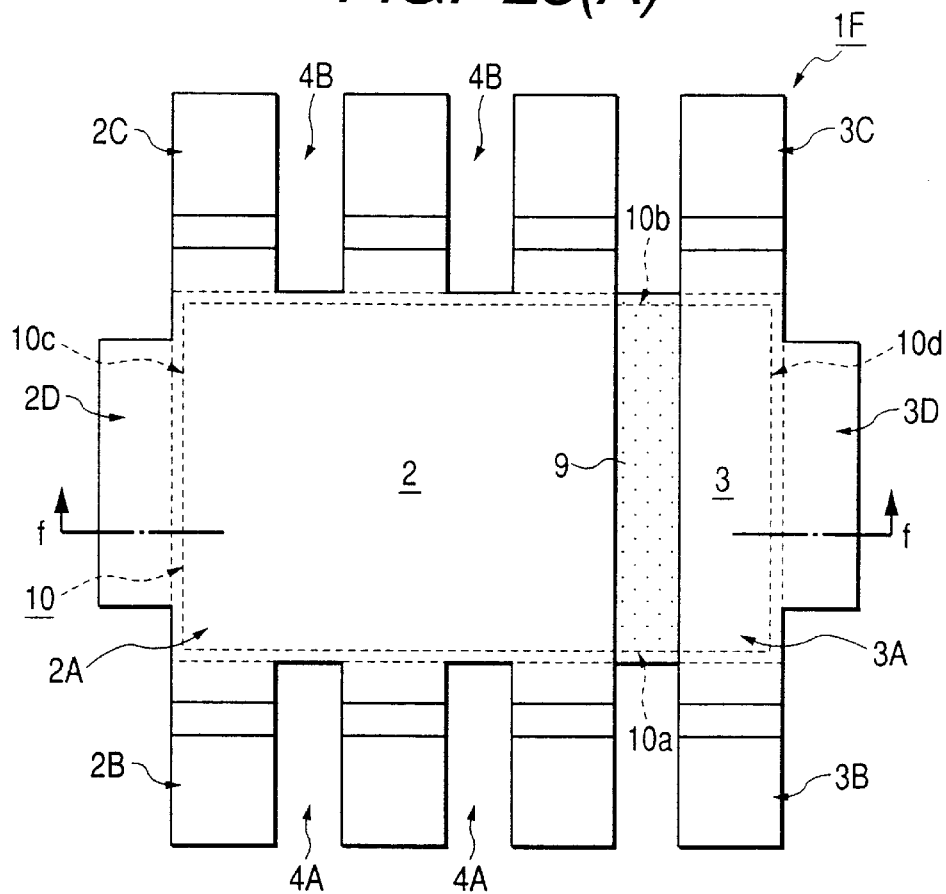
FIG. 23 is a view illustrating a schematic configuration of a power transistor according to an embodiment 6 of the present invention (wherein FIG. 23(A) is a typical plan view and FIG. 23(B) is a typical cross-sectional view taken along line f—f of FIG. 23(A))
Figure 23B:
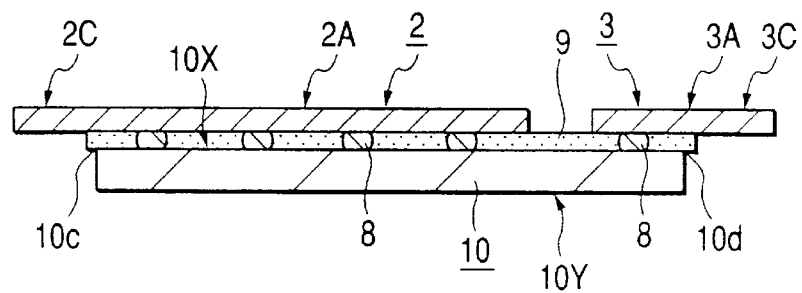

(Embodiment 6):

FIG. 23 is a view showing a schematic configuration of a power transistor according to an embodiment 6 of the present invention (wherein FIG. 23(A) is a typical plan view and FIG. 23(B) is a typical cross-sectional view taken along line f—f in FIG. 23(A)).

As shown in FIG. 23, a power transistor 1F according to the present embodiment is basically configured in a manner similar to the aforementioned embodiment 5 and different therefrom in the following configuration.

That is, a lead 2 has a first portion 2A, a second portion 2B and a third portion 2C and further includes a fourth portion 2D formed integrally with the first portion 2A and located outside one short side 10c of opposed two short sides (10c and 10d) of a semiconductor chip 10.

Further, a lead 3 has a first portion 3A, a second portion 3B and a third portion 3C and further includes a fourth portion 3D formed integrally with the first portion 3A and located outside the other short side 10d of the semiconductor chip 10.

Since the area in which each of the leads 2 and 3 contacts outside air, increases by a portion equivalent to the area of each of the fourth portions (2D and 3D) of the leads 2 and 3 owing to such a configuration, a heat radiation property is improved as compared with the aforementioned embodiment 5. However, the occupied area of the power transistor increases as compared with the embodiment 5.

Incidentally, the respective fourth portions (2D and 3D) of the leads 2 and 3 may be bent and formed in a gull-wing type. Since the area in which each of the leads 2 and 3 and a printed circuit board are joined to each other increases in this case, it is possible to further achieve an improvement in heat radiation property and a reduction in on resistance as compared with the embodiment 6.

Figure 24A:
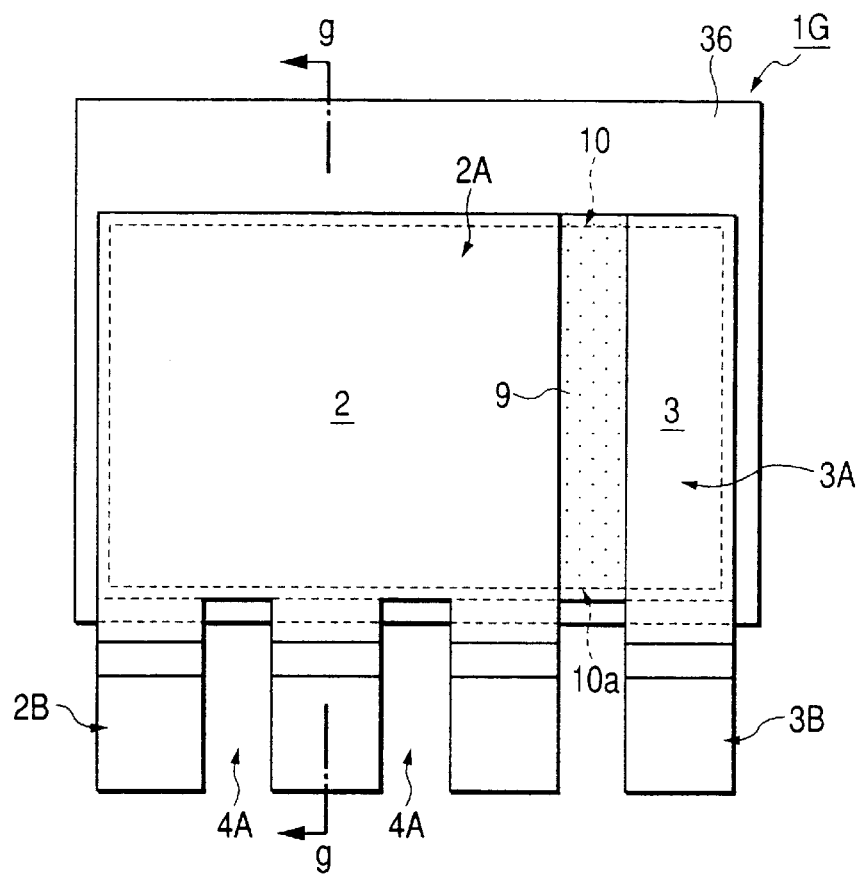
FIG. 24 is a view showing a schematic configuration of a power transistor according to an embodiment 7 of the present invention (wherein FIG. 24(A) is a typical plan view and FIG. 24(B) is a typical cross-sectional view taken along line g—g of FIG. 24(A))
Figure 24B:
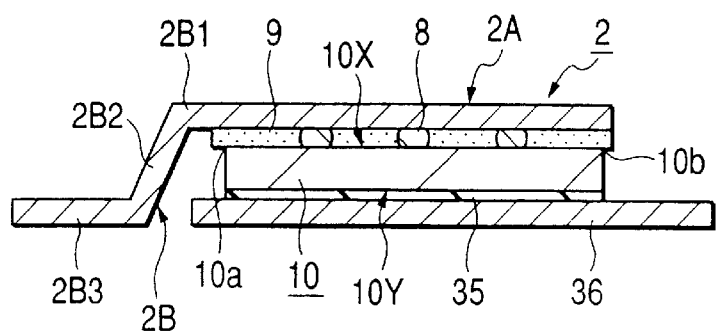

(Embodiment 7):

FIG. 24 is a view showing a schematic configuration of a power transistor according to an embodiment 7 of the present invention (wherein FIG. 24(A) is a typical plan view and FIG. 24(B) is a typical cross-sectional view taken along line g—g of FIG. 24(A)).

As shown FIG. 24, a power transistor 1G according to the present embodiment is basically configured in a manner similar to the aforementioned embodiment 1 and different therefrom in the following configuration.

That is, a thermal diffusion plate 36 is bonded and fixed to a rear surface 10Y of a semiconductor chip 10 with an adhesive 35 interposed therebetween. Since the rear surface 10Y of the semiconductor chip 10 can be protected owing to such a configuration, the breakage of the semiconductor chip 10 can be restrained from occurring. Further, since the thermal diffusion plate 36 diffuses heat produced in the semiconductor chip 10, the power transistor is improved in heat radiation property.

Figure 25:
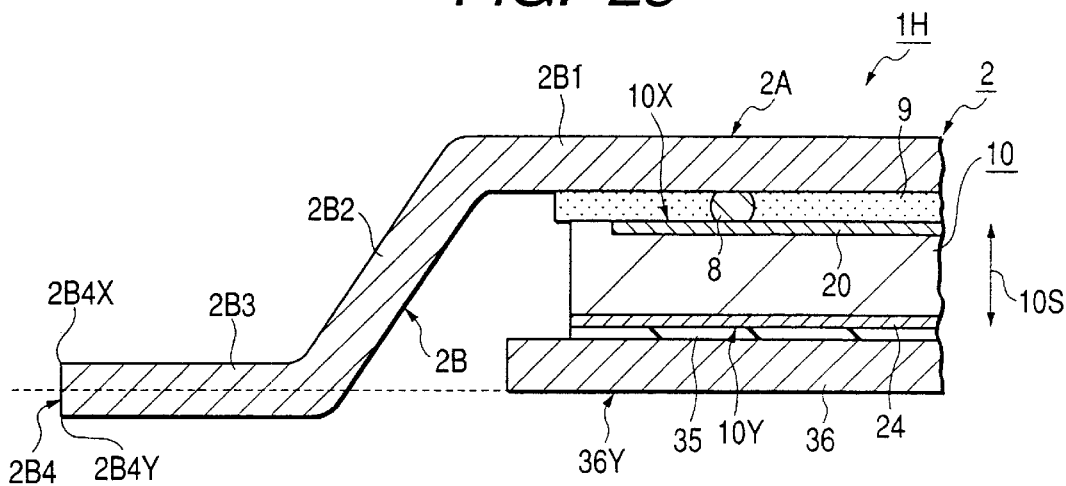
FIG. 25 is a typical cross-sectional view for describing a tip position of a lead shown in FIG. 24.

Incidentally, the power transistor 1G according to the present embodiment is formed so that the thermal diffusion place 36 is bonded to chip connecting terminals of a printed circuit board with the adhesive interposed therebetween. It is thus desirable that as shown in FIG. 25 (corresponding to a typical cross-sectional view for describing a tip position of each lead), tip portions (2B4 and 3B4) of respective second portions (23 and 3B) of leads 2 and 3 are respectively disposed at such heights that upper edge portions (2B4X and 3B4X) of the lip portions (2B4 and 334) are higher than a rear surface 36Y of the thermal diffusion plate 36 as viewed in a thickness direction 10S of the semiconductor chip 10 and lower edge portions (2B4 and 3B4) of the tip portions (2B4 and 3B4) thereof are lower than the rear surface 36Y of the thermal diffusion plate 36 as viewed in the thickness direction 10S thereof.

Figure 26:
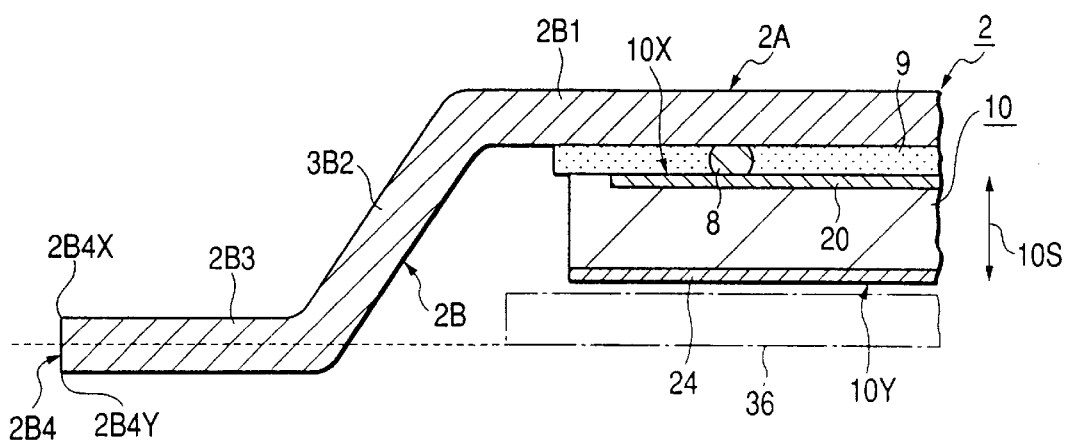
FIG. 26 is a typical cross-sectional view for describing the lead tip position.

There may be a case in which the thermal diffusion plate 36 is mounted in a mounting process. In such a case, it is necessary to bend the leads 2 and 3 so that the tip portions (2B4 and 3B4) of the respective second portions (2B and 3B) of the leads 2 and 3 are respectively disposed at a height lower than the rear surface 10Y of the semiconductor chip 10 as viewed in the thickness direction 10S of the semiconductor chip 10 as shown in FIG. 26 (corresponding to a typical cross-sectional view for describing a tip posit on of each lead) in consideration of the thickness of the mounted thermal diffusion plate 36 and the thickness of the adhesive.

Figure 27A:
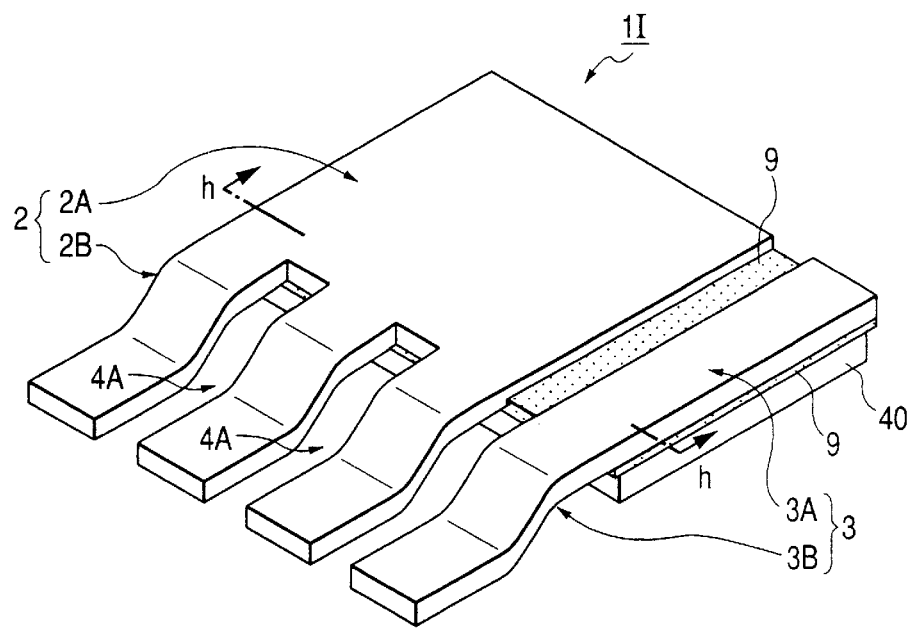
FIG. 27 is a view showing a schematic configuration of a power transistor according to an embodiment 8 of the present invention (wherein FIG. 27(A) is a typical perspective view and FIG. 27(B) is a typical cross-sectional view taken along line h—h of FIG. 27(A))
Figure 27B:
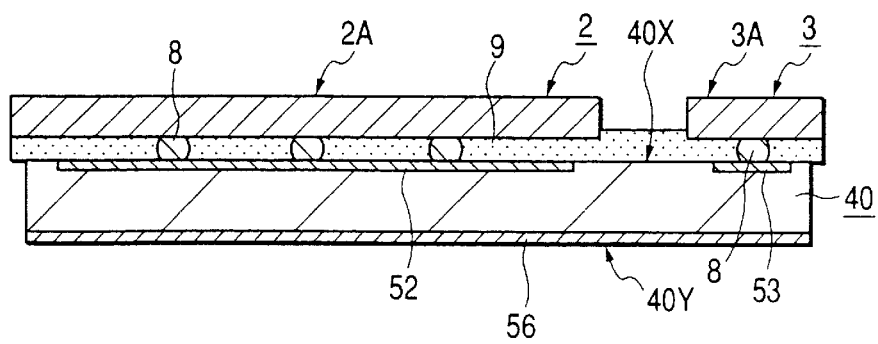
Figure 28:
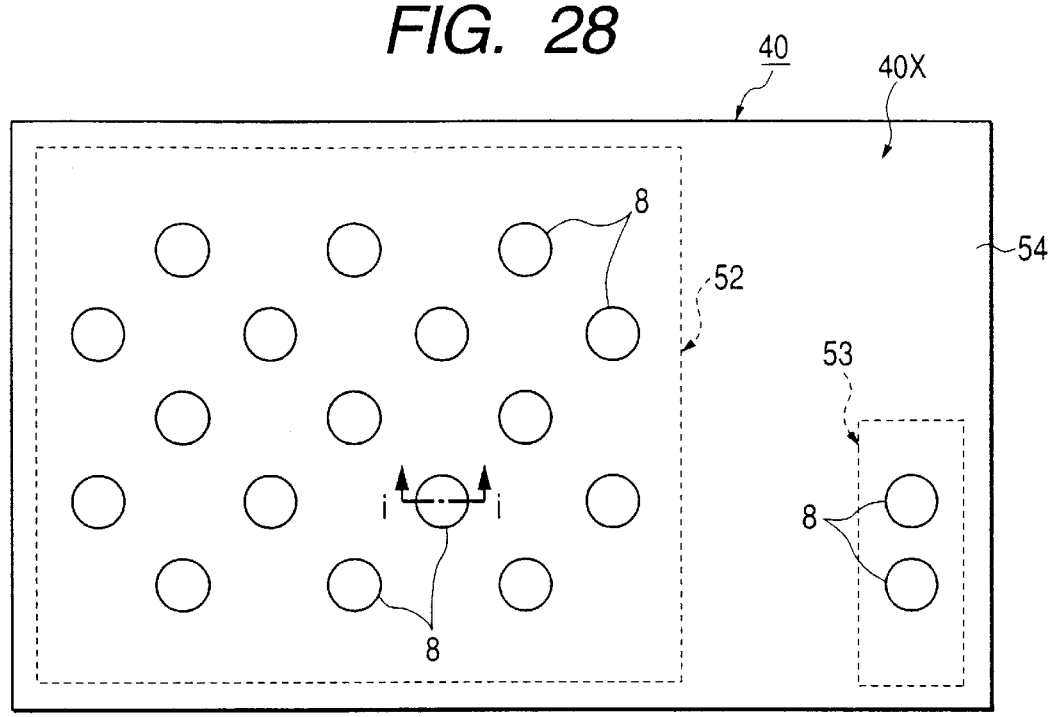
FIG. 28 is a typical plan view illustrating a schematic configuration of a semiconductor chip shown in FIG. 27.
Figure 29:
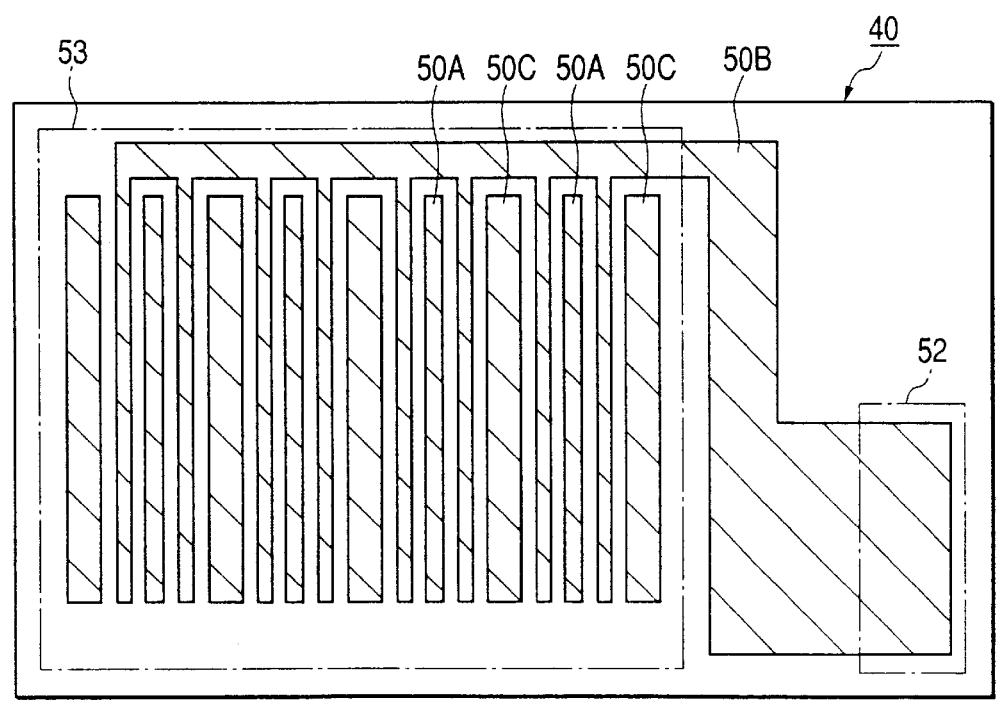
FIG. 29 is a typical plan view showing wiring patterns on the semiconductor chip shown in FIG. 27.
Figure 30:
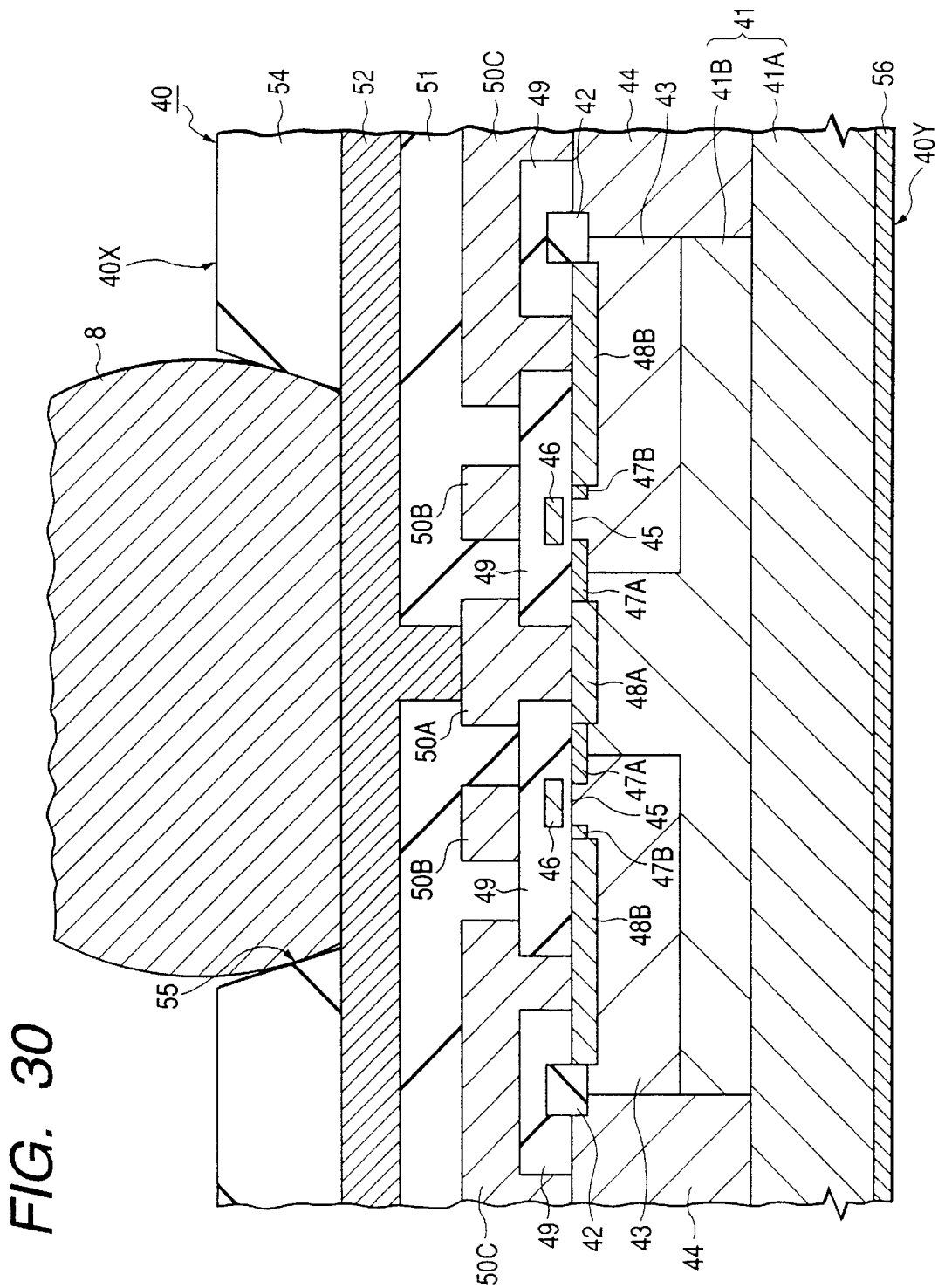
FIG. 30 is a typical cross-sectional view taken along line i—i of FIG. 28.

(Embodiment 8):

FIG. 27 is a view showing a schematic configuration of a power transistor according to an embodiment 8 of the present invention (wherein FIG. 27(A) is a typical plan view and FIG. 27(3) is a typical cross-sectional view taken along line h—h of FIG. 27(A)), FIG. 28 is a typical plan view illustrating a schematic configuration of a semiconductor chip shown in FIG. 27, FIG. 29 is a typical plan view depicting wiring patterns on the semiconductor chip shown in FIG. 27, and FIG. 30 is a typical cross-sectional view taken along line i—i of FIG. 28, respectively.

As shown in FIG. 27, a power transistor 1I according to the present embodiment is basically configured in a manner similar to the aforementioned embodiment 1 and different therefrom in the following configuration.

That is, a semiconductor chip 40 has a drain electrode 52 and a gate electrode 53 formed within an element forming surface (first main surface) 40X and includes a source electrode 56 formed within a rear surface (second main surface) 40Y opposite to the element forming surface 40X.

A first portion 2A of a lead 2 is disposed on the drain electrode 52 of the semiconductor chip 40 and electrically connected to the drain electrode 52 with a plurality of projecting electrodes 8 interposed therebetween. A first portion 3A of a lead 3 is located on the gate electrode 53 of the semiconductor chip 40 and electrically connected to the gate electrode 53 with the plurality of projecting electrodes 8 interposed therebetween.

As shown in FIG. 30, the semiconductor chip 40 as comprised principally of a semiconductor substrate 41 in which a p– type semiconductor layer 41B composed of monocrystalline silicon is formed on a main surface of a p+ type semiconductor substrate 41A composed of monocrystalline silicon, for example. For example, an n channel conduction type MOSFET of a horizontal structure is formed within an element forming region (active region) lying within the main surface of the semiconductor substrate 41, as a transistor device.

Each MOSFET principally includes a channel forming region, a gate insulator 45, a gate conductor layer 46, and source and drain regions. The channel forming region comprises a p type well region 43 formed in the p– type semiconductor layer 413. The drain region is comprised of an n– type semiconductor region 47A formed in a p type well region 43 and the p– type semiconductor layer 41B, and an n+ type semiconductor region 48A formed in the p– type semiconductor layer 413 and electrically connected to the n– type semiconductor region 47A. The source region is comprised of an n– type semiconductor region 47B formed in the p type well region 43, and an n+ type semiconductor region 483 formed in the p type well region 43 and electrically connected to the n– type semiconductor region 473. The gate conductor layer 46 is formed of a poly-crystalline silicon film in which, for example, an impurity for reducing a resistance value is introduced. The gate insulator 45 is formed of a silicon oxide film, for example.

The gate conductor layer 46 extends in an X direction and is disposed in plural form in an Y direction with a predetermined interval defined between the adjacent gate conductor layers. The n– type semiconductor region 47A and n+ type semiconductor region 48A, and the n– type semiconductor region 47B and n+ type semiconductor region 48B are disposed so as to interpose the channel forming region below each gate conductor layer 46 therebetween and extend in the X direction in a manner similar to the gate conductor layer 46.

The n+ type semiconductor regions 48A and 48B are respectively electrically connected to interconnections 50A and 50C formed in a metal layer corresponding to a first layer through apertures or openings defined in an interlayer dielectric 49. Each interconnection 50C is electrically connected to a p+ type semiconductor region 44 formed in the p– type semiconductor layer 41B through each opening defined in the interlayer dielectric 49. The p+ type semiconductor region 44 is electrically connected to the p+type semiconductor substrate 41A, and the p+ type semiconductor substrate 41A is electrically connected to the source electrode 56 formed in a rear surface thereof. Although not illustrated in the drawing in detail, each gate conductor layer 46 is electrically connected to its corresponding interconnection 50B formed in the metal layer corresponding to the first layer through the opening defined in the interlayer dielectric 49.

The interconnections 50A and 50B are electrically connected 0o their corresponding drain and gate electrodes 52 and 53 formed in a metal layer corresponding to a second layer through each opening defined in an interlayer dielectric 51. The drain and gate electrodes 52 and 53 are covered with a surface protective film 54 formed thereabove, as shown in FIGS. 28 and 30. A plurality of bonding apertures or openings 55 are defined in the surface protective film 54. The plurality of projecting electrodes 8 are respectively electrically and mechanically connected to the drain ad gate electrodes 52 and 53 through the plurality of bonding openings 55.

Incidentally, the respective interconnections 50A, 50B and 50C are respectively formed in wiring patterns shown in FIG. 29. In FIG. 30, reference numeral 42 indicates a field insulating film.

Even in the case of the power transistor 1I configured in this way, an effect similar to the aforementioned embodiment 1 can be obtained.

(Embodiment 9):

In the present embodiment, an example in which the present invention is applied to a wide-band video amplifier corresponding to a semiconductor device, will be explained.

Figure 31A:
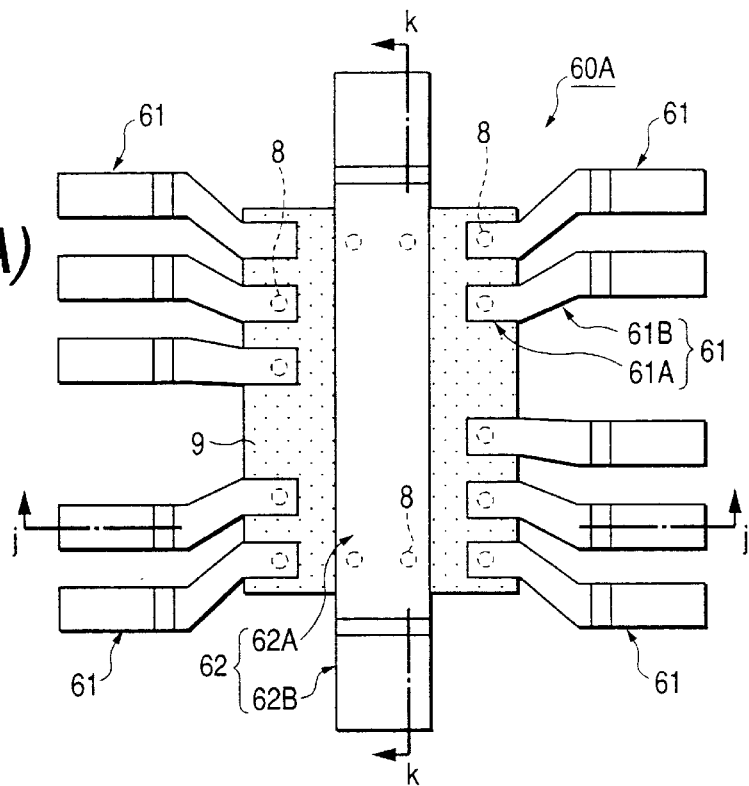
FIG. 31 is a view showing a schematic configuration of a wide-band video amplifier according to an embodiment 9 of the present invention (FIG. 31(A) is a typical plan view, FIG. 31(B) is a typical cross-sectional view taken along line j—j of FIG. 31(A) and FIG. 31(C) is a typical cross-sectional view taken along line k—k of FIG. 31(A))
Figure 31B:
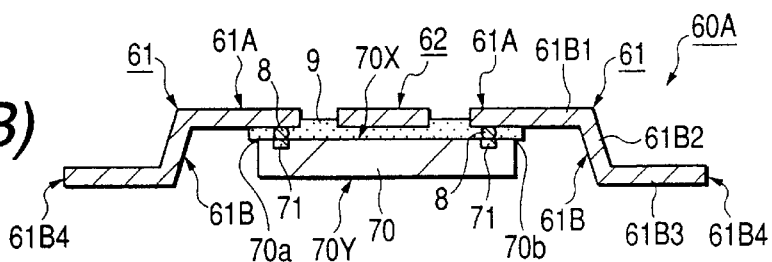
Figure 31C:
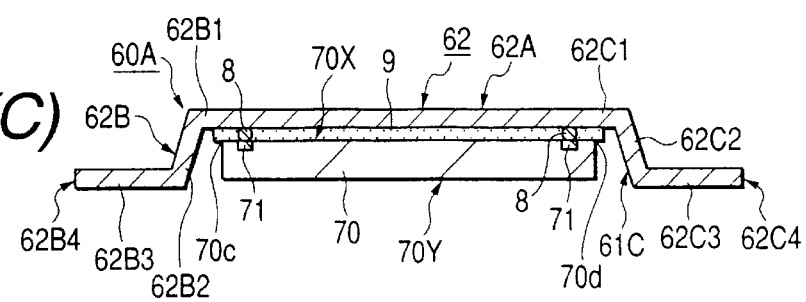
Figure 32:
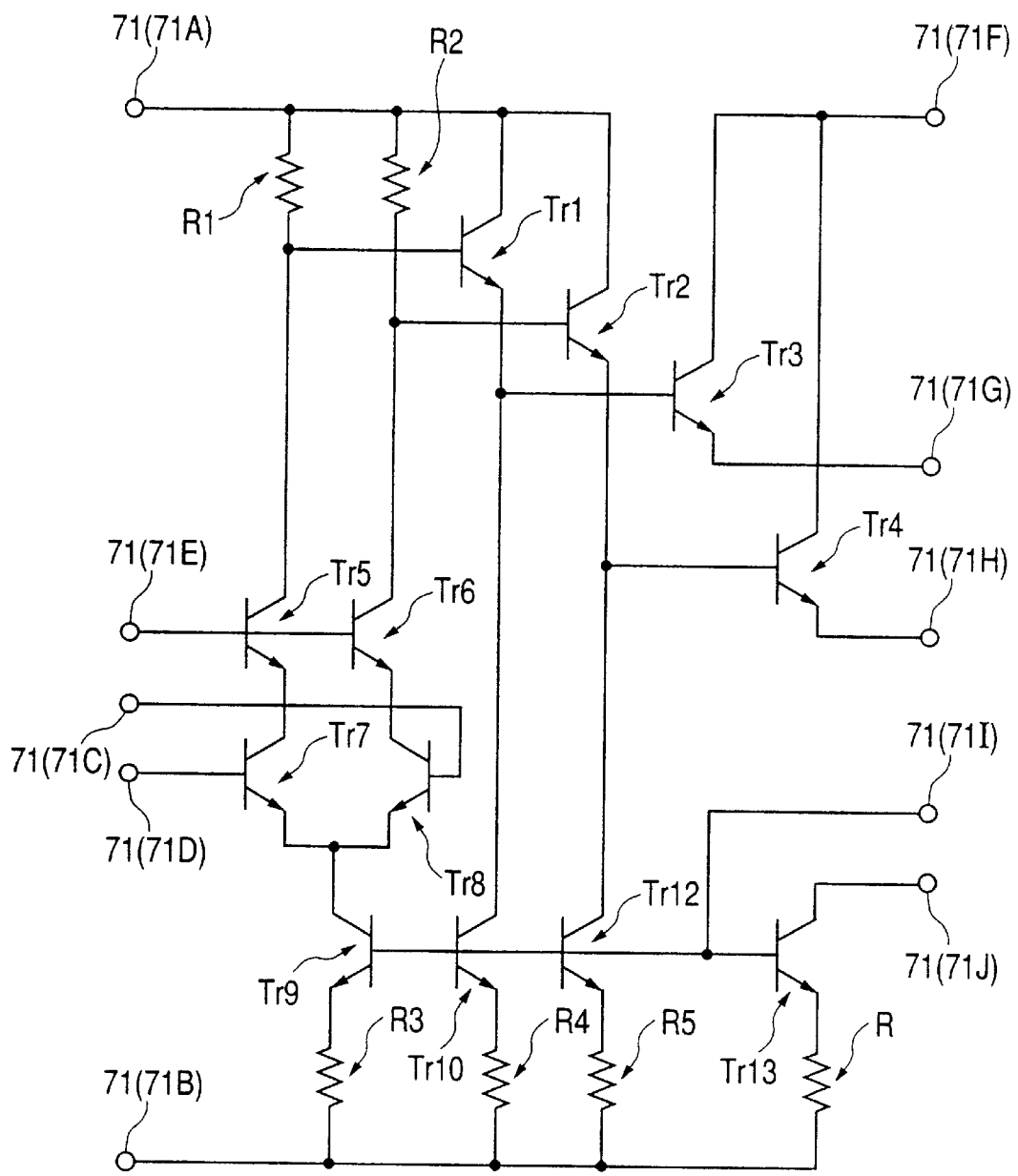
FIG. 32 is an equivalent circuit diagram of the wide-band video amplifier shown in FIG. 31.
Figure 33:
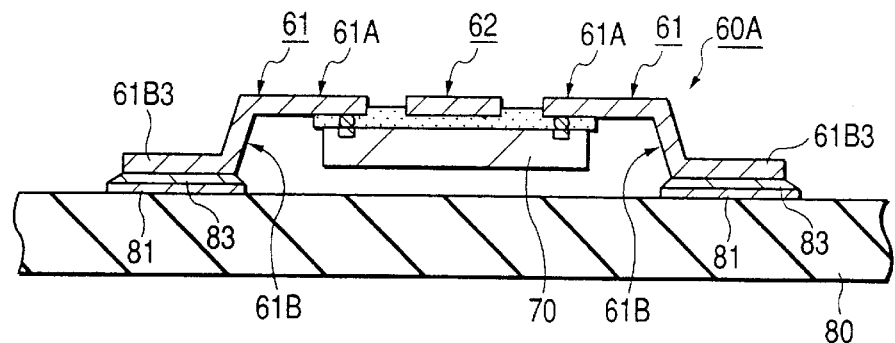
FIG. 33 is a typical cross-sectional view showing a state in which the wide-bard video amplifier is mounted on a printed circuit board.

FIG. 31 is a view showing a schematic configuration of a wide-band vide amplifier according to an embodiment 9 of the present invention (wherein FIG. 31(A) is a typical plan view, FIG. 31(B) is a typical cross-sectional view taken along line j—j of FIG. 31(A), and FIG. 31(C) is a typical cross-sectional view taken along line k—k of FIG. 31(A)). FIG. 32 is an equivalent circuit diagram of the wide-band video amplifier shown in FIG. 31. FIG. 33 is a typical cross-sectional view showing a state in which the wide-band vide amplifier shown in FIG. 31 is mounted on a printed circuit board.

As shown in FIG. 31 the wide-band video amplifier 60A according to the present embodiment is comprised principally of a plurality of leads 61, a lead 62, a plurality of projecting electrodes 8, an insulating sheet 9 and a semiconductor chip 70.

A plane form or figuration of the semiconductor chip 70 is shaped in square form. In the present embodiment, plane figuration thereof is shaped in the form of a rectangle. The semiconductor chip 70 is comprised principally of a semiconductor substrate, a multilayer interconnection layer obtained by stacking an insulating layer and a wiring layer on a main surface of the semiconductor substrate in the form of plural stages, and a surface protective film formed so as to cover the multilayer interconnection layer.

A plurality of electrodes 71 are formed on a circuit forming surface 70X corresponding to the surface of the front and rear surfaces (first main surface and second main surface) opposite to each other, of she semiconductor chip 70 along respective sides of the outer periphery of the semiconductor chip 70. The plurality of electrodes 71 are respectively formed in the wiring layer corresponding to the uppermost or top layer in the multilayer interconnection layer. The wiring layer corresponding to the top layer is covered with a surface protective film formed thereabove. Bonding apertures or openings for exposing the surfaces of the electrodes 71 are defined in the surface protective film.

An amplifier circuit shown in FIG. 32 is formed on the circuit forming surface 70X of the semiconductor chip 70. The amplifier circuit is comprised principally of a plurality of bipolar transistors Tr1 through Tr13, a plurality of resistive elements R1 through R5, etc. Of the plurality of electrodes 71 in FIG. 32, reference numeral 71A indicates a source potential terminal fixed to a source potential (e.g., 5[V]), reference numeral 71B indicates a reference potential terminal fixed to a reference potential (e.g., 0[V]), reference numerals 71C and 71D indicate signal input terminals respectively, reference numeral 71E indicates an intermediate potential terminal fixed to an intermediate potential, reference numeral 71F indicates an output stage source potential terminal, reference numerals 71G and 71H indicate current output terminals, reference numeral 71I indicates a control signal input terminal, and reference numeral 71J indicates an intermediate potential terminal fixed to an intermediate potential, respectively. An electrode 713 is provided in plural form.

As shown in FIG. 31, the plurality of leads 61 are arranged on the sides of ooposed two long sides (70a and 70b) of the semiconductor chip 70 along their long sides. The lead 62 extends between the leads 61 arranged on the side of one long side 70 a of the semiconductor chip 70 and the leads 61 arranged on the side of the other long side 70b thereof, so as to cross two short sides (70c and 70b) opposite to each other, of the semiconductor chip 70.

The plurality of leads 61 respectively have first portions 61A located on the electrodes 71 of the semiconductor chip 70 and second portions 61C formed integrally with the first portions and located outside either one long side (70a or 70b) of the semiconductor chip 70. The lead 62 has a first portion 62A located on the electrodes 71 of the semiconductor chip 70, a second portion 523 formed integrally with the first portion 62A and located outside the one long side 70c of the semiconductor chip 70, and a third portion 62C formed integrally with the first portion 62A and located outside the other long side 70d of the semiconductor chip 70.

The first portions 61A of the leads 61 are electrically and mechanically connected to their corresponding electrodes 71 of the semiconductor chip 70 with the projecting electrodes 8 interposed therebetween. Further, the first portions 61A are bonded and fixed to the circuit forming surface 70X of the semiconductor chip 70 with the insulating sheet 9 interposed therebetween. The first portion 62A of the lead 52 is electrically and mechanically connected to the electrodes 71 of the semiconductor chip 70 with the projecting electrodes 8 interposed therebetween. Further, the first portion 62A is bonded and fixed to the circuit forming surface 70X of the semiconductor chip 70 with the insulating sheet 9 interposed therebetween. That is, the first portions (61A and 62A) of each lead 61 and the lead 62 are heed to the circuit forming surface 70X of the semiconductor chip 70 by the insulating sheet 9 and the projecting electrodes 8. Incidentally, one of the plurality of leads 61 is not electrically connected to the electrode 71 of the semiconductor chip 70.

The second portions 61B of the leads 61, and the second portion 62B and third portion 62C of the lead 62 are bent and formed in a gull-wing type corresponding to one of lead figurations for surface mount. That is, the second portion 61B of each lead 61, and the second portion 62B and third portion 62C of the lead 62 respectively have projecting parts (61B1, 62B1 and 62C1) which project from the first portions (61A and 61A) to the outside of the semiconductor chip 70, transitional parts (61B2, 62B2 and 62C2) respectively bent toward the rear surface 70Y of the semiconductor chip 70 from the projecting parts, and mounting parts (61B3, 62B3 and 62C3) which extend in the same direction as the projecting parts from the transitional parts.

The width of the lead 62 is broader than that of each lead 61 for the purpose of improving a heat radiation property. The lead 62 is electrically connected to its corresponding electrode 71B used as the reference potential terminal, of the plurality of electrodes 71. That is, the lead 62 is used as a lead for a reference potential.

The insulating sheet 9 is placed between the respective first portions (2A and 23) of the leads 2 and 3 and the semiconductor chip 10 and covers the element forming surface 10X of the semiconductor chip 10 except for a region in which the plurality of projecting electrodes 8 are placed.

The wide-band video amplifier 60A configured in this way is mounted on a semiconductor substrate 80 as shown in FIG. 33 (corresponding to a typical cross-sectional view showing a state in which it is implemented on a printed circuit board). The mounting part 63B3 of each lead 61 is electrically and mechanically connected to its corresponding lead connecting terminal (part of each interconnection) 81 of the printed circuit board 80 by a conductive adhesive (e.g., conductive material having Pb—Sn composition) 83. Although not illustrated in the drawing, the mounting parts 61B3 and 61C3 of the lead 62 are electrically and mechanically connected to their corresponding lead connecting terminals of the printed circuit board 80 in a manner similar to above.

According to the wide-band video amplifier 60A constructed in this way, an effect similar to that obtained in the aforementioned embodiment 1 can be obtained.

Since the electrical connections between the electrodes 71 of the semiconductor chip 70 and the leads (61 and 62) are made by the projecting electrodes 8, conducting paths between the electrodes of the semiconductor chip 70 and the leads 61 become short. It is therefore possible to achieve the speeding up of the wide-band video amplifier 60A.

Figure 34:
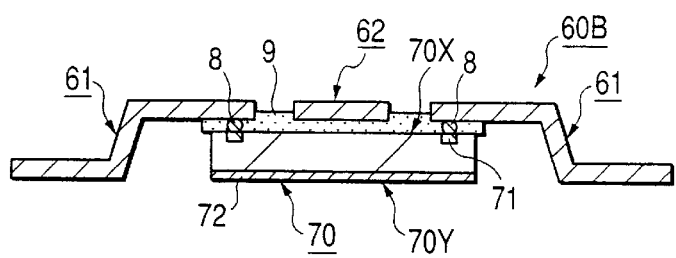
FIG. 34 is a typical cross-sectional view illustrating a schematic configuration of a wide-band video amplifier according to an embodiment 10 of the present invention.
Figure 35:
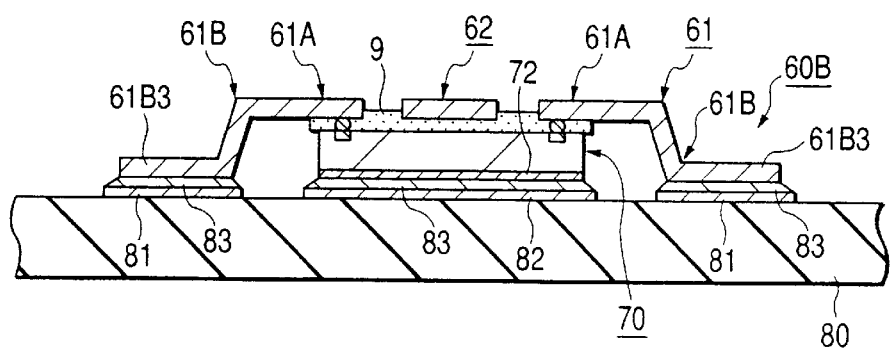
FIG. 35 is a typical cross-sectional view showing a state in which the wide-band video amplifier shown in FIG. 34 is mounted on a printed circuit board.

(Embodiment 10):

FIG. 34 is a typical cross-sectional view of a wide-band video amplifier according to an embodiment 10 of the present invention, and FIG. 35 is a typical cross-sectional view showing a state in which the wide-band video amplifier shown in FIG. 34 is mounted on a printed circuit board, respectively.

As shown in FIG. 34, a wide-band video amplifier 60B according to the present embodiment is basically configured in a manner similar to the aforementioned embodiment 9 and different therefrom in the following configuration.

That is, an adhesion accelerating layer 72 having a property wet to a conductive adhesive is provided on a rear surface 70Y of a semiconductor chip 70.

Owing to such a configuration, the rear surface 70Y of the semiconductor chip 70 can be connected to a chip connecting land 82 of a printed circuit board 80 by an adhesive 83 as shown in FIG. 35 when the wide-band video amplifier 60B is mounted on the printed circuit board. Therefore, the wide-band video amplifier 60B can be improved in heat radiation property.

While the invention made by the present inventors has been described specifically by the above-described embodiments, the present invention is not limited to the embodiments. It is needless to say that various changes can be made thereto within the scope not departing from the substance thereof.

The present invention can be applied to, for example, power transistors equipped with switching elements, such as a bipolar transistor, an insulated gate bipolar transistor, etc.

Further, the present invention can be applied to a power IC equipped with switching elements and circuits such as a protection circuit, etc.

Advantageous effects obtained by typical ones of the inventions disclosed in the present application will be described briefly as follows:

According to the present invention, a reduction in the thickness of a semiconductor device can be achieved.

According to the present invention, an improvement in the heat radiation property of a semiconductor device can be achieved.

According to the present invention, a reduction in the on resistance of a semiconductor device can be achieved.

According to the present invention, the speeding up of a semiconductor device can be achieved.

What is claimed is:

1. A method of manufacturing a semiconductor package, comprising the steps of:
   (a) providing a semiconductor chip and a lead frame having a first lead and a second lead, said semiconductor chip having a first main surface and a second main surface opposite to said first main surface, and first and second electrodes formed on said first main surface, each of said first and second leads having a first portion and a second portion which is continuously formed with said first portion;
   (b) performing a bending operation to said lead frame such that a bent portion is formed between said first and second portions of each of said first and second leads; and
   (c) after the step (b), attaching said lead frame to said semiconductor chip via projecting electrodes and an insulating sheet of a resin material, such that said first portions of said first and second leads are disposed on said first main surface of said semiconductor chip and are electrically connected to said first and second electrodes of said semiconductor chip respectively via said projecting electrodes, and such that said insulating sheet is disposed between said first main surface of said semiconductor chip and said first portions of said first and second leads and seals with said first main surface of said semiconductor chip.

2. A method of manufacturing a semiconductor package according to claim 1, wherein said projecting electrodes recited step (c) are formed in step (a) such that step (a) includes a step of forming said projecting electrodes on said first and second electrodes of said semiconductor chip and a step of adhering said insulating sheet to said first portions of said first and second leads of said lead frame, and wherein step (c) includes a step of attaching said projecting electrodes with said semiconductor chip to said first portions of said first and second leads through said insulating sheet by heat treatment.

3. A method of manufacturing a semiconductor package according to claim 1, wherein step (b) is performed such that the tips of said second portions of said first and second leads are positioned at the vicinity of said second main surface of said semiconductor chip upon the completion of step (c).

4. A method of manufacturing a semiconductor package according to claim 1, wherein said insulating sheet includes a thermosetting resin and a thermoplastic resin not containing conductive particles.

5. A method of manufacturing a semiconductor package according to claim 1, wherein said projecting electrodes are formed of Au-bump.

* * * * *